United States Patent
Adachi et al.

(10) Patent No.: US 9,681,593 B2
(45) Date of Patent: *Jun. 13, 2017

(54) ESD PROTECTION DEVICE AND METHOD FOR MANUFACTURING THE SAME

(71) Applicant: Murata Manufacturing Co., Ltd., Nagaokakyo-shi, Kyoto-fu (JP)

(72) Inventors: Jun Adachi, Koka (JP); Jun Urakawa, Omihachiman (JP); Issei Yamamoto, Sabae (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 142 days.

This patent is subject to a terminal disclaimer.

(21) Appl. No.: 14/608,403

(22) Filed: Jan. 29, 2015

(65) Prior Publication Data

US 2015/0140201 A1    May 21, 2015

Related U.S. Application Data

(60) Division of application No. 14/294,203, filed on Jun. 3, 2014, now Pat. No. 8,975,099, which is a division
(Continued)

(30) Foreign Application Priority Data

Nov. 26, 2008  (JP) ................................ 2008-301633
Nov. 26, 2008  (JP) ................................ 2008-301641
Nov. 26, 2008  (JP) ................................ 2008-301652

(51) Int. Cl.
*H05K 9/00*    (2006.01)
*H01T 4/12*    (2006.01)
(Continued)

(52) U.S. Cl.
CPC .............. *H05K 9/0067* (2013.01); *H01T 4/12* (2013.01); *H01T 21/00* (2013.01); *H02H 9/044* (2013.01);
(Continued)

(58) Field of Classification Search
CPC ........... H01T 21/00; H01T 4/12; H02H 9/044; H05K 9/0067; H05K 9/0079; Y10T 29/49002
(Continued)

(56) References Cited

U.S. PATENT DOCUMENTS

| 7,633,735 B2* | 12/2009 | Urakawa ................... H01T 4/12 361/112 |
| 2009/0045907 A1* | 2/2009 | Hoidis ................. H01C 7/1006 338/21 |
| 2009/0110917 A1* | 4/2009 | Albaugh ............... H01L 23/296 428/336 |

FOREIGN PATENT DOCUMENTS

JP    WO 2008146514 A1 * 12/2008  ............... H01T 4/12

OTHER PUBLICATIONS

Official Communication issued in corresponding European Patent Application No. 09 828 800.4, mailed on Mar. 2, 2016.
(Continued)

*Primary Examiner* — Charles Capozzi
*Assistant Examiner* — Jose Hernandez-Diaz
(74) *Attorney, Agent, or Firm* — Keating & Bennett, LLP

(57) ABSTRACT

An ESD protection device is manufactured such that its ESD characteristics are easily adjusted and stabilized. The ESD protection device includes an insulating substrate, a cavity provided in the insulating substrate, at least one pair of discharge electrodes each including a portion exposed in the cavity, the exposed portions being arranged to face each other, and external electrodes provided on a surface of the
(Continued)

insulating substrate and connected to the at least one pair of discharge electrodes. A particulate supporting electrode material having conductivity is dispersed between the exposed portions of the at least one pair of discharge electrodes in the cavity.

5 Claims, 20 Drawing Sheets

Related U.S. Application Data of application No. 13/765,719, filed on Feb. 13, 2013, now Pat. No. 8,779,466, which is a division of application No. 13/113,111, filed on May 23, 2011, now Pat. No. 8,426,889, which is a continuation of application No. PCT/JP2009/006199, filed on Nov. 18, 2009.

(51) Int. Cl.
*H01T 21/00* (2006.01)
*H02H 9/04* (2006.01)

(52) U.S. Cl.
CPC ...... *H05K 9/0079* (2013.01); *Y10T 29/49002* (2015.01)

(58) Field of Classification Search
USPC ......... 427/58, 96.1–99.5; 257/173, 177, 690, 257/693; 361/56, 220; 438/25, 381, 597
See application file for complete search history.

(56) References Cited

OTHER PUBLICATIONS

Imanaka, Y. et al., "Low Temperature Cofired Ceramics (LTCC) Technology", Springer Science and Business Media, Chapters 1 and 2, 2005, 58 pages.
Adachi et al.; "ESD Protection Device and Method for Manufacturing the Same", U.S. Appl. No. 13/113,111, filed May 23, 2011.
Adachi et al.; "ESD Protection Device and Method for Manufacturing the Same", U.S. Appl. No. 13/765,719, filed Feb. 13, 2013.
Adachi et al.; "ESD Protection Device and Method for Manufacturing the Same", U.S. Appl. No. 14/294,203, filed Jun. 3, 2014.

\* cited by examiner

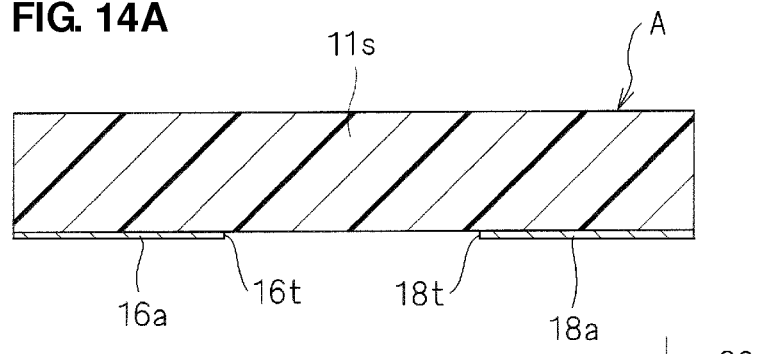
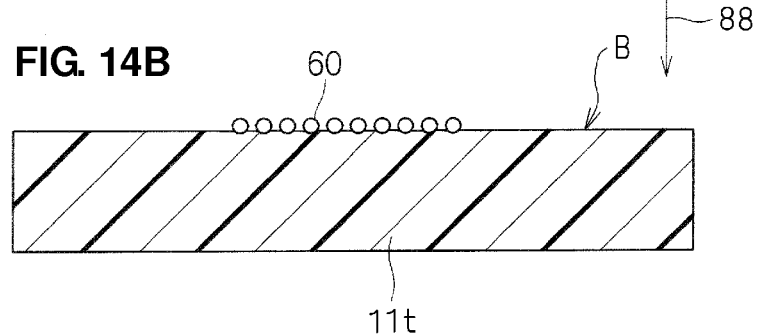
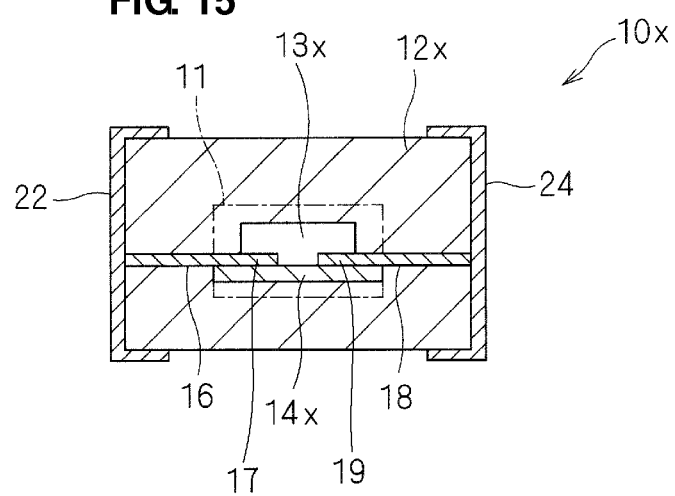

ESD PROTECTION DEVICE AND METHOD FOR MANUFACTURING THE SAME

BACKGROUND OF THE INVENTION

1. Field of the Invention

The present invention relates to an electrostatic discharge (ESD) protection device and a method for manufacturing the ESD protection device, and particularly to an ESD protection device having improved ESD characteristics, such as discharge starting voltage, and reliability in which discharge electrodes are disposed in a cavity of an insulating substrate so as to face each other.

2. Description of the Related Art

ESD is a phenomenon in which strong discharge is generated when a charged conductive body (e.g., human body) comes into contact with or comes sufficiently close to another conductive body (e.g., electronic device). ESD causes damage or malfunctioning of electronic devices. To prevent this, an excessively high voltage generated during discharge must be prevented from being applied to circuits of the electronic devices. ESD protection devices, which are also called surge absorbers, are used for such an application.

An ESD protection device is disposed, for instance, between a signal line and a ground of a circuit. The ESD protection device includes a pair of discharge electrodes facing each other with a space provided therebetween. Therefore, the ESD protection device has high resistance under normal operation and a signal is not sent to the ground. An excessively high voltage, for example, generated by static electricity through an antenna of a cellular phone causes discharge between the discharge electrodes of the ESD protection device, which leads the static electricity to the ground. Thus, a voltage generated by static electricity is not applied to the circuits disposed downstream from the ESD protection device, which protects the circuits.

For example, an ESD protection device shown in an exploded perspective view of FIG. 37 and a sectional view of FIG. 38 includes a cavity 5 provided in a ceramic multilayer substrate 7 including a plurality of laminated insulating ceramic sheets 2. Discharge electrodes 6 facing each other and electrically connected to external electrodes 1 are disposed in the cavity 5 that includes a discharge gas. When a breakdown voltage is applied between the discharge electrodes 6, discharge is generated between the discharge electrodes 6 in the cavity 5, which leads an excessive voltage to the ground. Consequently, the circuits disposed downstream from the ESD protection device are protected (see, for example, Japanese Unexamined Patent Application Publication No. 2001-43954).

However, in such an ESD protection device, the discharge responsivity to ESD varies significantly due to the variation in the distance between the discharge electrodes. Furthermore, although the responsivity to ESD needs to be adjusted using an area of the region sandwiched between discharge electrodes facing each other, the amount of adjustment is limited by the size of the product or other factors. Therefore, it may be difficult to achieve a desired responsivity to ESD.

Furthermore, a discharge phenomenon is efficiently caused by employing a structure in which a conductive material is dispersed between discharge electrodes. However, with such a structure, since the conductive material is scattered due to an impact caused during discharge and thus the distribution density is decreased, the discharge voltage is gradually increased each time discharge is performed. Consequently, discharge characteristics are degraded after repetitive discharges.

Moreover, such an ESD protection device poses the following problems.

Firstly, a discharge starting voltage is primarily set by adjusting the distance between discharge electrodes. However, the distance between discharge electrodes is varied because of variations that occur during production and a difference in shrinkage behavior between a ceramic multilayer substrate and discharge electrodes during firing. Consequently, the discharge starting voltage of an ESD protection device varies. Therefore, the discharge starting voltage cannot be set with high precision.

Secondly, discharge electrodes in a cavity may be detached from a ceramic multilayer substrate because of a decrease in the hermeticity of the cavity or a difference in a coefficient of thermal expansion (may be referred to as "thermal expansivity") between a base layer of the ceramic multilayer substrate and the discharge electrodes. In such a case, the device becomes unusable as an ESD protection device, or the discharge starting voltage is changed and, thus, the reliability of the ESD protection device is degraded.

SUMMARY OF THE INVENTION

To overcome the problems described above, preferred embodiments of the present invention provide an ESD protection device having ESD characteristics that are easily adjusted and stabilized, whose discharge characteristics are not degraded even after repetitive discharges, and whose discharge starting voltage can be set with high precision and a method for manufacturing the ESD protection device.

An ESD protection device according to a preferred embodiment of the present invention preferably includes an insulating substrate, a cavity provided in the insulating substrate, at least a pair of discharge electrodes each including a portion exposed in the cavity, the exposed portions being arranged to face each other, and external electrodes provided on a surface of the insulating substrate and connected to the discharge electrodes. A particulate supporting electrode material having conductivity is preferably dispersed between the exposed portions of the discharge electrodes in the cavity.

In the above-described structure, since a supporting electrode material having conductivity is dispersed between the exposed portions of the discharge electrodes arranged to face each other, electrons easily move in the cavity and, thus, a discharge phenomenon can be more efficiently produced. Thus, fluctuations in responsivity to ESD caused by variation in the distance between discharge electrodes are reduced.

Furthermore, by adjusting the amount and particle size of the supporting electrode material dispersed in the cavity, desired ESD characteristics (e.g., discharge starting voltage) can be easily achieved.

Therefore, the ESD characteristics can be easily adjusted and stabilized.

The supporting electrode material is preferably coated with an insulating material.

In this case, since the supporting electrode material is coated with an insulating material, short circuits between the discharge electrodes caused by contact between adjacent particles of the supporting electrode material are effectively prevented.

In the cavity, creeping discharge is easily generated along a creepage surface between an insulator and a space. By coating the supporting electrode material with an insulating material, more creepage surfaces are provided in the cavity, which further improves the responsivity to ESD.

Furthermore, by decreasing the size of a gap between particles of the supporting electrode material coated with the insulating material, a loss caused by gaseous discharge is reduced and, thus, the degradation of discharge characteristics is prevented.

An insulating material is preferably dispersed in the cavity.

In this case, contact between particles of the supporting electrode material is prevented by the insulating material dispersed in the cavity. Thus, short circuits between discharge electrodes caused by the contact between adjacent particles of the supporting electrode material are prevented.

The insulating substrate is preferably a ceramic substrate.

In this case, the ESD protection device can be easily manufactured.

The ceramic substrate preferably includes a glass component. A sealing member arranged to prevent the glass component in the ceramic substrate from entering the cavity is preferably disposed between the ceramic substrate and the cavity.

In this case, since the sealing member prevents the glass component in the ceramic substrate from entering the cavity, the necking of the supporting electrode material in the cavity caused by the glass component that has entered the cavity is prevented.

The degradation of an insulating property between the discharge electrodes caused when the glass component that has entered the cavity erodes the insulating material which coats the supporting electrode material or the insulating material dispersed between particles of the supporting electrode material is also prevented.

According to another preferred embodiment of the present invention, preferably, the supporting electrode material is a conductive material dispersed between the discharge electrodes in the cavity, and the conductive material is in contact with a bottom surface and a top surface that define the cavity.

In the above-described configuration, when a voltage equal to or greater than a certain voltage is applied between the external electrodes, discharge is generated between the exposed portions of the discharge electrodes that face each other. This discharge is primarily creeping discharge generated along the interface between a space of the cavity and the insulating substrate. Since the conductive material disposed in a dispersed manner is in contact with the interface along which the creeping discharge is generated, that is, the top surface and the bottom surface that define the cavity, electrons move easily and, thus, a discharge phenomenon is more efficiently produced, which improves the responsivity to ESD. Thus, fluctuations in responsivity to ESD caused by a variation in the distance between discharge electrodes are effectively prevented. Therefore, the ESD characteristics are easily adjusted and stabilized.

Since the conductive material that causes creeping discharge is preferably in contact with both the bottom surface and the top surface that define the cavity, the responsivity to ESD can be further improved as compared to the case in which a conductive material is dispersed on only one of the surfaces.

Furthermore, since the conductive material is preferably in contact with both the bottom surface and the top surface that define the cavity, detachment of the conductive material from the substrate body is prevented. Consequently, the degradation of ESD characteristics caused by repetitive discharges (e.g., an increase in discharge starting voltage) is prevented.

A portion of the conductive material is preferably buried in the insulating substrate.

In this case, the conductive material is not only in contact with the insulating substrate, but is also buried in the insulating substrate. Thus, detachment of the conductive material from the insulating substrate is more effectively prevented.

The insulating substrate is preferably a ceramic substrate including a ceramic material and a glass material. The conductive material is fixed to the insulating substrate using the glass material.

In this case, the conductive material is not only in contact with the insulating substrate, but is also fixed using the glass material. Thus, detachment of the conductive material from the insulating substrate is more effectively prevented.

When a glass layer is made of a glass material provided on an inner circumferential surface that defines the cavity, the surface roughness of the inner circumferential surface that defines the cavity is decreased. Therefore, the distance that electrons move during creeping discharge is decreased, and, thus, the responsivity to ESD is further improved.

According to another preferred embodiment of the present invention, a supporting electrode portion is preferably formed by disposing conductive material powder, which is the supporting electrode material, along an inner surface that defines the cavity between the exposed portions of the discharge electrodes, the conductive material powder being disposed in a single layer such that only a single particle of the conductive material powder is included in a thickness direction.

In the above-described configuration, the conductive material powder of the supporting electrode portion may preferably be disposed below the inner surface that defines the cavity so as not to be exposed at all in the cavity or may preferably protrude from the inner surface that defines the cavity into the cavity so as to be partly exposed in the cavity.

In the above-described configuration, the conductive material powder of the supporting electrode portion may preferably be disposed in a uniform density, or may preferably be disposed in a non-uniform density, for example, in the form of a belt defined by a single row or a plurality of rows, a mesh, or an island, for example.

In the above-described configuration, by adjusting the amount and type of conductive material of the supporting electrode portion, the discharge starting voltage can be set to a desired voltage. Thus, the discharge starting voltage can be set with high precision as compared to the case in which a discharge starting voltage is adjusted only by changing the distance between the discharge electrodes arranged to face each other. Since the conductive material powder of the supporting electrode portion is disposed in a single layer such that only a single particle of the conductive material powder is provided in a thickness direction, the probability that particles of the conductive material powder of the supporting electrode portion contact each other is decreased and the generation of short circuits between the discharge electrodes is prevented. Thus, the short-circuit resistance is effectively improved.

Furthermore, by forming the supporting electrode portion along the inner surface of the cavity using a conductive material that is the same as or similar to the material of the discharge electrodes, the differences in shrinkage behavior and coefficient of thermal expansion between the supporting electrode portion and the discharge electrodes are reduced in a region between the discharge electrodes. As a result, failure or characteristic variations due to, for example, detachment of the discharge electrodes or changes in characteristics over time are prevented.

At least a portion of the conductive material powder of the supporting electrode portion is preferably exposed in the cavity from the inner surface that defines the cavity.

In this case, by exposing the conductive material of the discharge electrodes, creeping discharge is further promoted and the ESD characteristics are further improved. For example, the discharge starting voltage is decreased and the responsivity to ESD is improved.

The conductive material powder of the supporting electrode portion is preferably coated with a non-conductive material.

In this case, contact between particles of the conductive material powder of the supporting electrode portion is easily prevented.

The supporting electrode portion preferably includes a portion arranged along an interface between the insulating substrate and the discharge electrodes.

In the above-described configuration, the alignment precision between the supporting electrode portion and the discharge electrodes is improved as compared to the case in which a supporting electrode portion is provided in only a certain region between the exposed portions of the discharge electrodes. Consequently, variations in discharge starting voltage are decreased and the production cost is effectively reduced.

The insulating substrate is preferably a ceramic substrate.

In the above-described configuration, by providing the supporting electrode portion along the inner surface of the cavity using a conductive material whose shrinkage behavior during firing is the same as or similar to the material of the discharge electrodes, the difference in the shrinkage behavior between the discharge electrodes and the ceramic substrate is reduced near a region between the exposed portions of the discharge electrodes. As a result, failure and characteristic variation due to, for example, detachment of the discharge electrodes during firing are prevented. In addition, the variation in discharge starting voltage is prevented because the variation in the distance between the discharge electrodes is also prevented.

The coefficient of thermal expansion around the supporting electrode portion may preferably be adjusted to an intermediate value between that of the discharge electrodes and that of the ceramic substrate. This reduces the difference in a coefficient of thermal expansion between the discharge electrodes and the ceramic substrate in the supporting electrode portion, thereby preventing failure due to detachment of the discharge electrodes and changes in characteristics over time.

A method for manufacturing an ESD protection device according to another preferred embodiment of the present invention preferably includes a first step of forming at least a pair of discharge electrodes on at least one of a principal surface of a first insulating layer and a principal surface of a second insulating layer, the pair of discharge electrodes being arranged with a space therebetween, a second step of attaching, in a dispersed manner, a supporting electrode material having conductivity to a portion between the pair of discharge electrodes formed on the one of the principal surface of the first insulating layer and the principal surface of the second insulating layer, a third step of laminating the first insulating layer and the second insulating layer while the principal surface of the first insulating layer and the principal surface of the second insulating layer face each other, and a fourth step of forming external electrodes on a surface of a laminated body obtained through the third step such that the external electrodes are connected to the discharge electrodes. A cavity is formed between the first insulating layer and the second insulating layer inside the laminated body, the pair of discharge electrodes each includes a portion exposed in the cavity, and the supporting electrode material is disposed in the cavity in a dispersed manner.

In the above-described method, an ESD protection device can be easily manufactured in which the supporting electrode material is dispersed between the discharge electrodes that face each other in the cavity and ESD characteristics can be adjusted and stabilized.

A method for manufacturing an ESD protection device according to another preferred embodiment of the present invention preferably includes a first step of attaching a conductive material to a principal surface of a first insulating layer in a dispersed manner, a second step of forming at least a pair of discharge electrodes on the principal surface of the first insulating layer, the discharge electrodes being arranged with a space therebetween, so that at least a portion of the conductive material attached to the principal surface of the first insulating layer is exposed between the discharge electrodes, a third step of laminating a second insulating layer on the principal surface of the first insulating layer so that a principal surface of the second insulating layer covers the discharge electrodes and is in contact with the conductive material, and a fourth step of forming external electrodes on a surface of a laminated body obtained through the third step such that the external electrodes are connected to the discharge electrodes. A cavity is formed between the principal surface of the first insulating layer and the principal surface of the second insulating layer. The pair of discharge electrodes each preferably includes a portion that is exposed in the cavity. In the cavity, the conductive material is in contact with the principal surface of the first insulating layer and the principal surface of the second insulating layer, and a gap is formed between particles of the conductive material.

In the above-described method, the principal surface of the first insulating layer and the principal surface of the second insulating layer define the top surface and the bottom surface that define the cavity. Therefore, the conductive material can be easily formed so as to be in contact with the top surface and the bottom surface that define the cavity.

In the third step, a portion of the conductive material is preferably buried in at least one of the first insulating layer and the second insulating layer by press-bonding the principal surface of the second insulating layer onto the principal surface of the first insulating layer.

In this case, the conductive material is not only in contact with the insulating substrate, but is also buried in the insulating substrate. Thus, detachment of the conductive material from the insulating substrate is more effectively prevented.

Each of the first insulating layer and the second insulating layer are preferably primarily made of a ceramic material. The above-described method preferably includes a step of firing the laminated body obtained through the third step.

In this case, an ESD protection device can be easily manufactured by the same method as that of a ceramic multilayer substrate. Herein, the step of firing the laminated body may be performed before or after the fourth step.

In the step of firing the laminated body, the conductive material is preferably buried in at least one of the first insulating layer and the second insulating layer by shrinking the laminated body in a lamination direction.

In this case, the conductive material can be buried by using the shrinkage caused when the first insulating layer and the second insulating layer, each primarily made of a ceramic material, are fired.

Preferably, at least one of the first insulating layer and the second insulating layer includes a glass material, and, in the step of firing the laminated body, a glass layer made of the glass material is formed in a region of the principal surface of the insulating layer, the region facing a portion to be the cavity.

In this case, the conductive material can be fixed to the insulating layer more securely due to the diffusion of the glass material. Furthermore, since the surface roughness of the inner circumferential surface that defines the cavity is decreased, the distance that electrons move during creeping discharge is decreased, and, thus, the responsivity to ESD is further improved.

In the first step, a gap-forming material dispersed together with the conductive material is preferably attached to the principal surface of the first insulating layer. The gap is formed between particles of the conductive material by eliminating the gap-forming material from the laminated body obtained through the third step.

In this case, the gap is preferably formed between particles of the conductive material through the elimination of the gap-forming material and, thus, the generation of short circuits caused between the discharge electrodes by the contact between adjacent particles of the conductive material is effectively prevented.

In the first step, the conductive material and the gap-forming material are preferably attached to the principal surface of the first insulating layer in a mixed arrangement.

In this case, the conductive material is easily disposed in the cavity in a dispersed manner.

In the first step, a mixed material of chargeable powder including the conductive material and chargeable powder including the gap-forming material is preferably attached to the principal surface of the first insulating layer by xerography.

In this case, a uniformly dispersed conductive material and gap-forming material can be attached to the principal surface of the first insulating layer. Thus, the distance between particles of the conductive material can be ensured with certainty and stable responsivity to ESD is achieved.

In the mixed material, the content of the chargeable powder including the conductive material is preferably between about 20% and about 80%, for example.

When the content of the chargeable powder including the conductive material is about 20% or greater, satisfactory ESD discharge characteristics are easily achieved due to the conductive material. When the content of the chargeable powder including the conductive material is about 80% or less, a gap having a sufficient size can be formed between particles of the conductive material and, thus, short circuits between the discharge electrodes are effectively prevented.

A method for manufacturing an ESD protection device according to another preferred embodiment of the present invention preferably includes a first step of forming a supporting electrode portion by disposing conductive material powder in a single layer such that only a single particle of the conductive material powder is provided in a thickness direction, the conductive material powder being disposed on a principal surface of a first insulating layer, a second step of forming at least a pair of discharge electrodes on the principal surface of the first insulating layer so that at least one portion of the supporting electrode portion is exposed between the discharge electrodes, a third step of forming a second insulating layer on the principal surface of the first insulating layer so that the second insulating layer coats the discharge electrodes and covers an exposed region in which the at least one portion of the supporting electrode portion is exposed between the discharge electrodes, the second insulating layer being separated from the exposed region, and a fourth step of forming external electrodes on a surface of a laminated body obtained through the third step such that the external electrodes are connected to the discharge electrodes. A cavity surrounded by the second insulating layer, the discharge electrodes, and the exposed region is formed.

In the above-described method, the conductive material powder being exposed in the cavity is easily formed.

Specifically, the conductive material powder may preferably be formed by the various methods described below.

In the second step, a cavity-forming layer including an elimination material is preferably formed on at least one portion of the supporting electrode portion that is to be exposed between the discharge electrodes. After the second insulating layer is formed on the cavity-forming layer in the third step, the cavity is formed by eliminating at least one portion of the cavity-forming layer.

In the first step, the supporting electrode portion is preferably formed by transferring, onto the first insulating layer, conductive material powder disposed in a single layer such that only a single particle of the conductive material powder is provided in a thickness direction.

In the first step, the supporting electrode portion is preferably formed by xerography.

In the first step, the conductive material powder of the supporting electrode portion disposed on the principal surface of the first insulating layer and in a single layer such that only a single particle of the conductive material powder is provided in a thickness direction, is preferably coated with an elimination material.

In this case, the contact between particles of the conductive material powder of the supporting electrode portion can be easily prevented.

According to a preferred embodiment of the present invention, the ESD characteristics of an ESD device are easily adjusted and stabilized.

According to another preferred embodiment of the present invention, the ESD characteristics of an ESD device are easily adjusted and stabilized and thus the degradation of discharge characteristics caused by repetitive discharges are prevented.

According to yet another preferred embodiment of the present invention, the discharge starting voltage can be set with high precision and an ESD protection device having high reliability can be manufactured.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 14A and 14B are sectional views showing a production process of an ESD protection device according to another preferred embodiment of the present invention.

FIG. 15 is a sectional view of an ESD protection device of a Comparative Example 1.

DETAILED DESCRIPTION OF THE PREFERRED EMBODIMENTS

Preferred embodiments of the present invention will now be described with reference to FIGS. 1 to 36.

Example 1-1

An ESD protection device 10 of an Example 1-1 of a preferred embodiment of the present invention will be described with reference to FIGS. 1 to 6.

Figure 1:
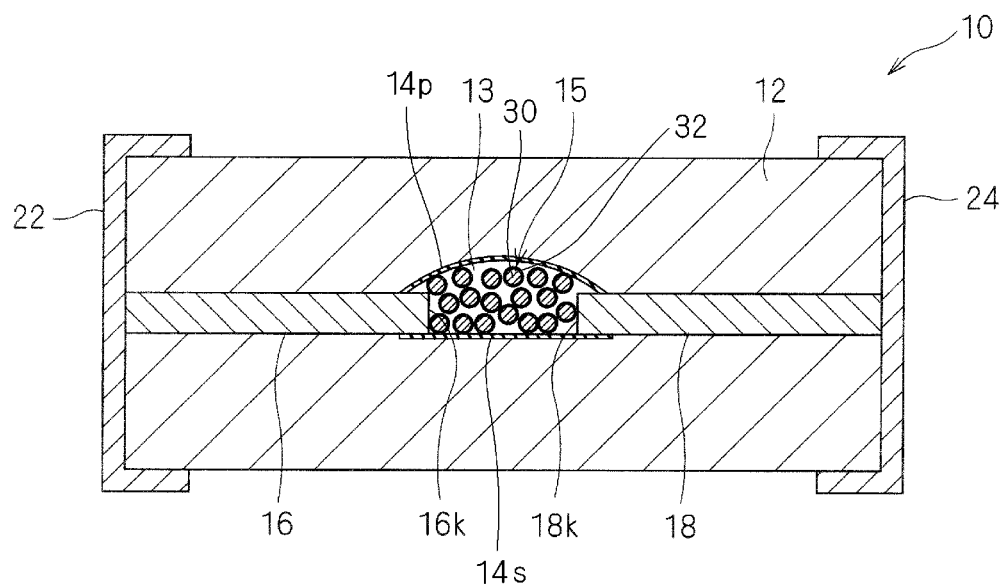
FIG. 1 is a sectional view of an ESD protection device according to a preferred embodiment of the present invention.

FIG. 1 is a sectional view of an ESD protection device 10. As shown in FIG. 1, the ESD protection device 10 preferably includes a cavity 13 provided in a substrate body 12 of a ceramic substrate. A pair of discharge electrodes 16 and 18 are arranged such that the respective edges 16k and 18k are exposed in the cavity 13. The discharge electrodes 16 and 18 are arranged so that the edges 16k and 18k face each other with a space provided therebetween. The discharge electrodes 16 and 18 extend to the peripheral surface of the substrate body 12 and are respectively connected to external electrodes 22 and 24 provided on the surface of the substrate body 12. The external electrodes 22 and 24 are used to connect the ESD protection device 10 to another device.

As schematically shown in FIG. 1, a plurality of supporting electrode particles 15 obtained by coating the surface of particulate supporting electrode material 30 having conductivity with an insulating material 32 are disposed in the cavity 13. That is, the particulate supporting electrode material 30 having conductivity is dispersed in the cavity 13.

Figure 2:
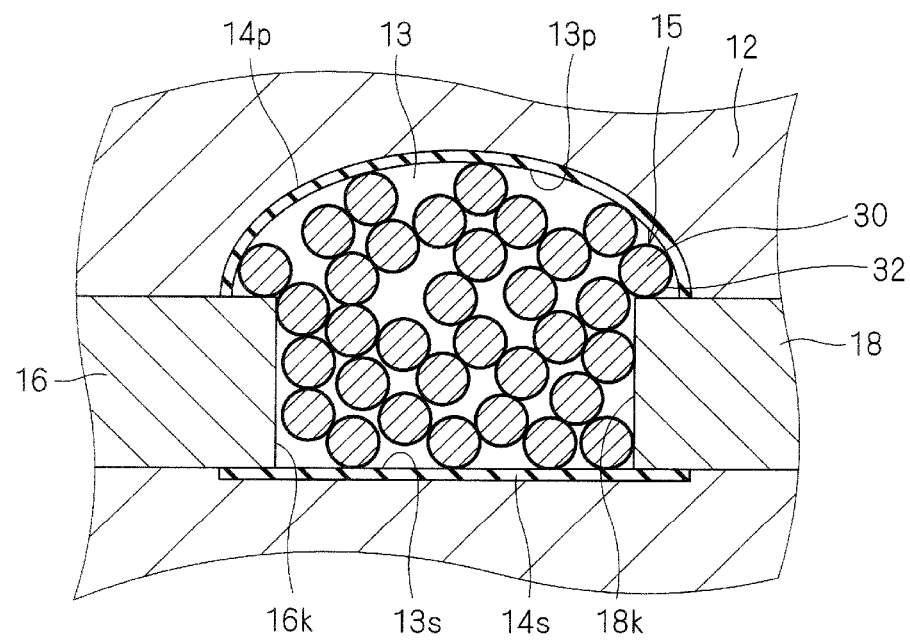
FIG. 2 is an enlarged sectional view of a cavity in the ESD protection device shown in FIG. 1.

FIG. 2 is an enlarged sectional view of the cavity 13. As schematically shown in FIG. 2, a top surface 13p and a bottom surface 13s that define the cavity 13 are respectively defined by sealing members 14p and 14s. The sealing members 14p and 14s are disposed between the substrate body 12 and the cavity 13 and prevent the glass component in the substrate body 12, which is a ceramic substrate, from entering the cavity 13. The sealing members 14p and 14s have an insulating property.

In the ESD protection device 10, when a voltage equal to or greater than a certain voltage is applied between the external electrodes 22 and 24, discharge is generated between the discharge electrodes 16 and 18 that face each other in the cavity 13.

A method for manufacturing the ESD protection device 10 will be described with reference to a conceptual diagram of FIG. 3 and a schematic view of FIG. 4.

First, materials for forming a substrate body 12, discharge electrodes 16 and 18, and sealing members 14p and 14s are prepared.

A ceramic green sheet for forming the substrate body 12 is prepared. A material primarily including Ba, Al, and Si (BAS material) is preferably used as a ceramic material. Raw materials are prepared and mixed so that the mixture has a desired composition, and then calcined at about 800° C. to about 1000° C. The calcined powder is pulverized using a zirconia ball mill for about 12 hours to obtain ceramic powder. An organic solvent, such as toluene or EKINEN, for example, is preferably added to the BAS material-calcined ceramic powder and mixed. A binder and a plasticizer are further added thereto and mixed to obtain a slurry. The obtained slurry is molded on a PET film by a doctor blade method to obtain a ceramic green sheet having a desired thickness of about 10 μm to about 50 μm, for example.

An electrode paste for forming the discharge electrodes 16 and 18 is prepared. A solvent is added to about 80 wt % Cu powder having an average particle size of about 2 μm, for example, and a binder resin including ethyl cellulose or other suitable resin, for example, and the mixture is stirred and mixed using a roll mill to obtain an electrode paste.

A sealing member-forming paste for forming the sealing members 14p and 14s is prepared by the same or substantially the same method as the electrode paste. A solvent is added to about 80 wt % $Al_2O_3$ powder having an average particle size of about 1 μm, for example, and a binder resin composed of ethyl cellulose or other suitable resin, for example, and the mixture is stirred and mixed using a roll mill to obtain a sealing member-forming paste (alumina paste). The sealing member is defined by a material having a sintering temperature greater than that of a substrate material.

Figure 4:
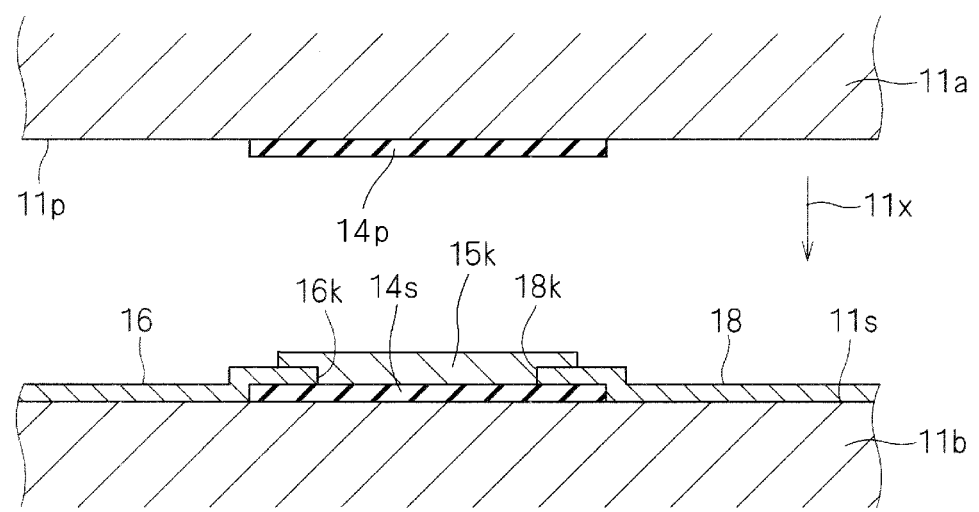
FIG. 4 is a sectional view showing a production process of an ESD protection device according to a preferred embodiment of the present invention.
Figure 5:
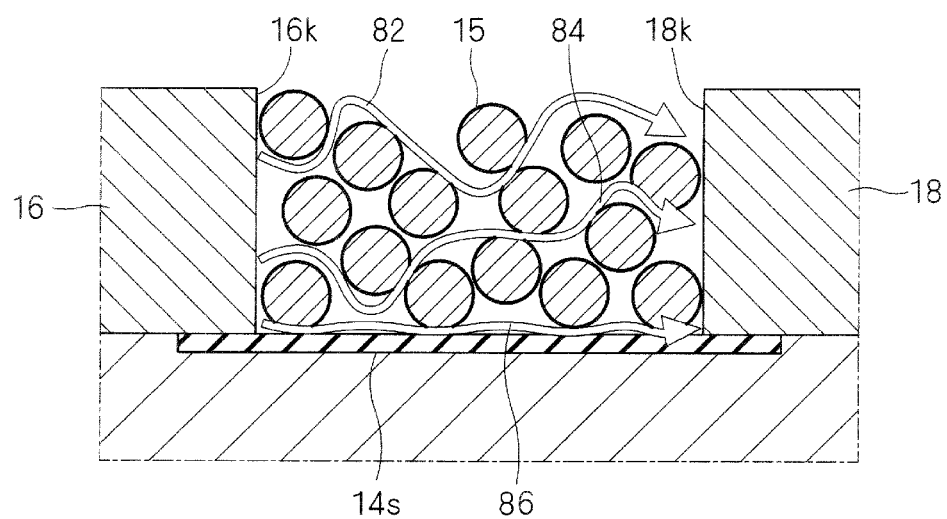
FIG. 5 is an explanatory view of discharge in an ESD protection device.

As shown in FIG. 4, the sealing member-forming paste (alumina paste) is applied by screen printing on surfaces 11p and 11s, which are respectively principal surfaces of ceramic green sheets 11a and 11b, to form sealing members 14p and 14s. The sealing member-forming paste is prepared in an amount equivalent to two layers because the sealing members 14p and 14s are arranged so as to sandwich the discharge electrodes 16 and 18 therebetween at their edges 16k and 18k in a vertical direction.

The discharge electrodes 16 and 18 are formed by screen printing on the surface 11s of the ceramic green sheet 11b, which is at least one the ceramic green sheets 11a and 11b on which the sealing members 14p and 14s are formed.

In the production example, the discharge electrodes 16 and 18 were preferably formed in a belt shape so that the width of each of the discharge electrodes 16 and 18 was about 100 μm, for example, and the discharge gap between the edges 16k and 18k of the discharge electrodes 16 and 18 that face each other was about 30 μm, for example.

Figure 3:
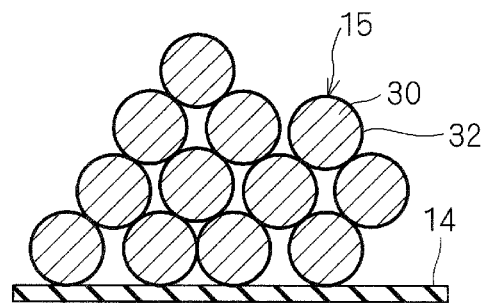
FIG. 3 is a conceptual diagram after a supporting electrode is formed in the ESD protection device shown in FIG. 1.

As shown in FIG. 3, supporting electrode particles 15 obtained by coating the surface of a supporting electrode material 30 with an insulating material 32 are attached, by screen printing or xerography, for example, to the ceramic green sheet 11b on which the sealing member 14s and the discharge electrodes 16 and 18 have been formed, to form a supporting electrode formation layer 15k shown in FIG. 4.

In the case of screen printing, a paste including the supporting electrode material is prepared, and a supporting electrode formation layer 15k is formed using the prepared paste, whereby the supporting electrode material is attached.

The paste including the supporting electrode particles 15 is preferably prepared by the following method.

Cu powder coated with alumina and having an average particle size of about 5 μm, for example, is prepared in a certain ratio. A binder resin and a solvent are added thereto and then stirred and mixed using a roll mill to obtain the paste. The content of the resin and the solvent in the paste is set to about wt %, for example. The Cu powder coated with alumina is not sintered during firing. That is, necking is not caused. The Cu powder coated with alumina maintains an insulating property even after firing.

The height of the cavity 13 can be controlled by adjusting the amount of the paste applied.

In the case in which the supporting electrode is formed by xerography, a toner including supporting electrode particles 15 is prepared, and then a supporting electrode formation layer is formed using the prepared toner.

The toner is prepared as follows.

1. Cu powder coated with alumina having an average particle size of about 5 μm and a resin are mixed with each other, and the surface of the Cu powder coated with alumina is covered with the resin using a surface-treating machine.

2. The sample obtained through the process 1 is classified to remove fine powder and coarse powder.

3. The capsulated Cu powder obtained through the process and an external additive are mixed with each other, and the external additive is uniformly attached to the surface of the capsulated Cu powder using a surface-treating machine.

4. The capsulated Cu powder obtained through the process 3 and a carrier are mixed with each other to obtain a toner, which is a developer.

The supporting electrode is formed as follows.

1. A photoconductor is uniformly charged.

2. The charged photoconductor is irradiated with light using an LED in a pattern of a supporting electrode, to form a latent image.

3. A development bias is applied to develop the toner on the photoconductor. The amount of the toner applied can be controlled in accordance with the magnitude of the development bias.

4. A ceramic green sheet is disposed on the photoconductor on which the pattern of a supporting electrode has been developed, to transfer the toner onto the sealing member 14s of the ceramic green sheet 11b.

5. The ceramic green sheet onto which the pattern of a supporting electrode has been transferred is inserted into an oven to fix the toner. Thus, a ceramic green sheet having a pattern of a supporting electrode is obtained.

Note that the supporting electrode itself maintains an insulating property even after firing.

As indicated by an arrow 11x in FIG. 4, the ceramic green sheets 11a and 11b are laminated and press-bonded with each other such that the surfaces 11p and 11s of the ceramic green sheets 11a and 11b on which the sealing members 14p and 14s have been formed face each other and the sealing members 14p and 14s sandwich the supporting electrode formation layer 15k. Thus, a laminated body is formed.

In this production example, the ceramic green sheets were laminated with each other so that the thickness of the laminated body was about 0.35 mm, for example, and the discharge electrodes and the supporting electrode formation layer were arranged in the center in the thickness direction.

In the case in which a laminated body including a plurality of ESD protection devices is formed, the laminated body is cut into chips using a die in the same or substantially the same manner as in a chip-type component, such as an LC filter. In this production example, the laminated body was cut into chips each having a size of about 1.0 mm×about 0.5 mm. After that, the electrode paste is applied to the end surfaces of each of the chips to form external electrodes.

The chip having the external electrodes formed thereon is fired in a N2 atmosphere in the same or substantially the same manner as in a typical ceramic multilayer component. The resin component and the solvent component included in the supporting electrode formation layer 15k sandwiched between the ceramic green sheets are eliminated during the firing, and thus, a space defining the cavity 13 is formed.

In the case in which an inert gas, such as Ar or Ne, for example, is introduced into the cavity 13 to decrease the response voltage to ESD, firing may be performed in an atmosphere of an inert gas, such as Ar or Ne, for example, in a temperature range in which a ceramic material is shrunk and sintered. If the electrode material is not oxidized (e.g., Ag), the firing may be performed in the air.

Electrolytic Ni plating and Sn plating are performed on the external electrodes of the fired chip in the same or substantially the same manner as in a chip-type component, such as an LC filter to complete an ESD protection device.

As described above, an ESD protection device can be easily manufactured using a ceramic substrate.

The ceramic material of the substrate body 12 is not particularly limited to the above-described material as long as the ceramic material has an insulating property. Therefore, such a ceramic material may preferably be a mixture of forsterite and glass, a mixture of $CaZrO_3$ and glass, or other suitable material, for example.

The electrode material of the discharge electrodes 16 and 18 is also not limited to Cu, and may preferably be Ag, Pd, Pt, Al, Ni, W, or a combination thereof, for example.

The supporting electrode material 30 is preferably at least one conductive material selected from transition metals, such as Cu, Ni, Co, Ag, Pd, Rh, Ru, Au, Pt, and Ir, for example. These metals may be used alone or in a form of an alloy. Furthermore, a resistive metal oxide of these metals or a semiconductor material, such as SiC, for example, may preferably be used.

Supporting electrode particles 15 are preferably formed by coating the surface of the supporting electrode material 30 with an inorganic material, such as $Al_2O_3$, $ZrO_2$, or $SiO_2$, a mixed calcined material such as BAS, or an insulating material 32, such as high melting point glass, for example. The insulating material 32 that coats the surface of the supporting electrode material 30 is used to prevent the sintering of the supporting electrode material 30. Any material may be used as long as the material has an insulating property.

The average particle size of the supporting electrode material 30 is preferably in a range of about 0.05 μm to about 10 μm, and more preferably about 1 μm to about 5 μm, for example. As the particle size is decreased, the surface area is increased, which leads to a decrease in discharge starting voltage. As a result, the responsivity to ESD is improved and the degradation of discharge characteristics is reduced.

The sealing members 14p and 14s are preferably made of a ceramic material having a sintering temperature greater than that of the ceramic material used for the substrate body 12. Any material, such as a nitride, for example, may be used as long as the material prevents glass from entering from the substrate body 12 and the material itself does not produce glass.

Since the supporting electrode material 30 is dispersed in the cavity 13 in the ESD protection device 10 of Example 1-1, the discharge starting voltage is decreased and the responsivity to ESD is improved.

In other words, a discharge phenomenon that occurs between discharge electrodes that face each other is primarily creeping discharge that is generated along the interface between a cavity (gas phase) and a substrate (insulator). It is to be noted that other discharge phenomena also occur. Creeping discharge is a discharge phenomenon in which current flows along a surface of a material (insulator). Although it has been described that electrons flow, it is believed that, in reality, the electrons move by hopping along the surface and ionizing the gas. The presence of conductive powder on the surface of an insulator decreases the distance which the electrons hop and imparts directionality to the electrons, thereby generating creeping discharge more actively.

Figure 6:
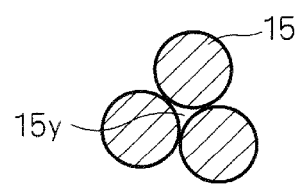
FIG. 6 is an explanatory view of a cavity.

In the ESD protection device 10 of Example 1-1, the supporting electrode particles 15 obtained by coating the surface of the supporting electrode material 30 having conductivity with the insulating material 32 are dispersed in a space between the discharge electrodes 16 and 18 facing each other, and the space is filled with the supporting electrode particles 15. In a portion in which the supporting electrode particles 15 are disposed, that is, in the supporting electrode, the supporting electrode material 30 is present in a state in which the supporting electrode material 30 is not sintered after firing, that is, in which necking is not caused. The supporting electrode particles 15 including the supporting electrode material 30 are simply stacked on top of each other, that is, are simply in contact with each other. As a result, a gap 15y is present between the supporting electrode particles 15 as shown in FIG. 6.

In the configuration of Example 1-1, creeping discharge is generated along the surfaces of the stacked supporting electrode particles 15, that is, in a gap between the surface of the insulating material 32 that coats the surface of the supporting electrode material 30 and the adjacent supporting electrode particle 15. In Example 1-1, as indicated by arrows 82, 84, and 86 in an explanatory view of FIG. 5, there are many paths of creeping discharge. Thus, creeping discharge is more easily generated as compared to Comparative Example 1 described later. That is, a discharge phenomenon can be efficiently produced. Therefore, the distance between the discharge electrodes 16 and 18 can be decreased, and the fluctuation in responsivity to ESD caused by variations in the distance between the discharge electrodes 16 and 18 is reduced.

In the configuration of Example 1-1, since the gap between the supporting electrode particles 15 is minute, a loss caused by gaseous discharge is reduced as compared to in Comparative Example 1. Therefore, the degradation of discharge characteristics can be reduced compared with in Comparative Example 1.

Furthermore, by adjusting the amount and particle size of a supporting electrode material dispersed in the cavity, desired ESD characteristics, e.g., discharge starting voltage, can be easily achieved.

Therefore, the ESD characteristics can be easily adjusted and stabilized.

The sealing members 14p and 14s prevent a glass component from entering from the ceramic substrate body 12. Thus, the sealing members 14p and 14s prevent the insulating material 32 that coats the supporting electrode material 30 from being eroded by a glass component and, therefore, the supporting electrode material 30 from being sintered, and also prevent the supporting electrode material 30 from diffusing into the ceramic substrate body 12. As a result, the gap between the supporting electrode particles 15 is maintained, and the ESD protection characteristics are improved.

Comparative Example 1

Figure 16:
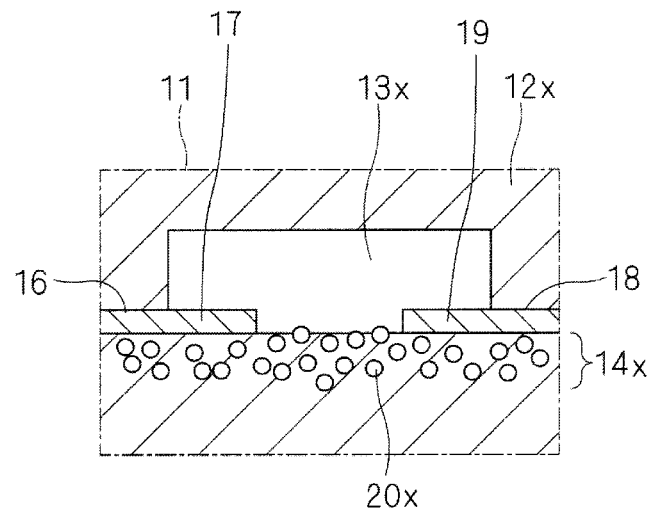
FIG. 16 is an enlarged sectional view of a principal portion of a supporting electrode of the Comparative Example 1.

An ESD protection device 10x of Comparative Example 1 will be described with reference to FIGS. 15 to 17.

FIG. 15 is a sectional view of an ESD protection device 10x. FIG. 16 is an enlarged sectional view of a principal portion that schematically shows a region 11 indicated by a chain line in FIG. 15. FIG. 17 is an explanatory view of discharge.

As shown in FIG. 15, the ESD protection device 10x includes a cavity 13x provided in a substrate body 12x of a ceramic multilayer substrate such that portions 17 and 19 of discharge electrodes 16 and 18 are exposed in the cavity 13x in a similar manner as in Example 1-1. The discharge electrodes 16 and 18 are respectively connected to external electrodes 22 and 24 provided on a surface of the substrate body 12x.

In the ESD protection device 10x, unlike in Example 1-1, a supporting electrode 14x is arranged so as to be adjacent to a portion between the discharge electrodes 16 and 18. As shown in FIG. 16, the supporting electrode 14x is a region in which a metal material 20x is dispersed in an insulating material defining the substrate body 12x and has an overall insulating property. A portion of the metal material 20x is exposed in the cavity 13x. The supporting electrode 14x is formed by applying a paste for a supporting electrode that includes, for example, a ceramic material and a metal material to a ceramic green sheet.

Figure 17:
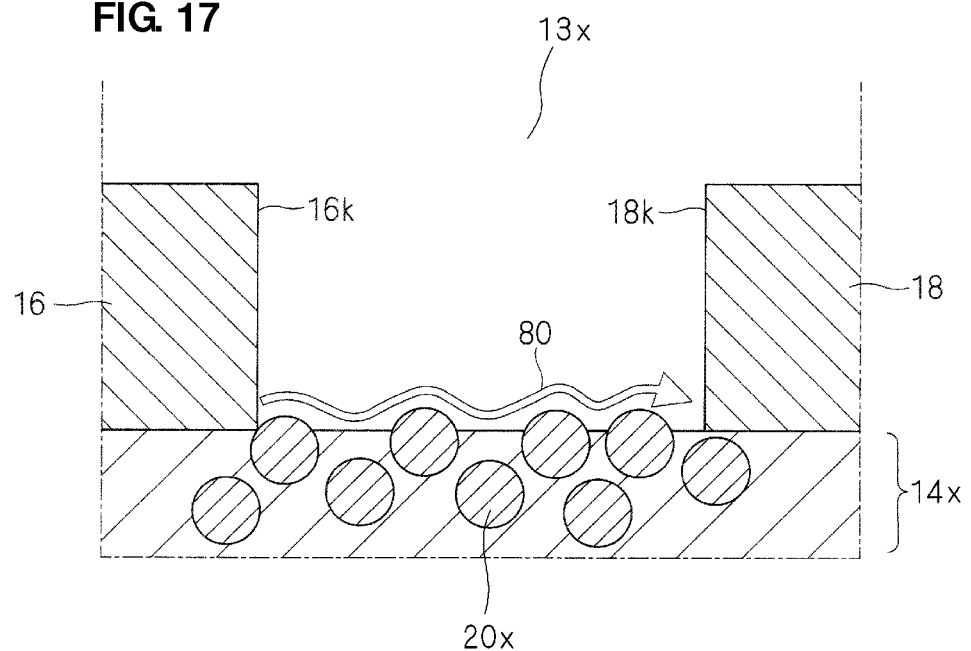
FIG. 17 is an explanatory view of discharge of the Comparative Example 1.

In Comparative Example 1, as indicated by an arrow 80 in FIG. 17, creeping discharge is generated along the interface between the supporting electrode 14x and the cavity 13x.

If the metal material 20x of the supporting electrode 14x that is exposed in the cavity 13x is detached due to the impact of discharge, the discharge characteristics are degraded. Therefore, the discharge characteristics are easily degraded in Comparative Example 1.

For production examples of the ESD protection devices of Comparative Example 1 and Example 1-1, the ESD protection characteristics were compared to each other.

Specifically, in the production example of Example 1-1, a supporting electrode formation portion was formed by screen printing. In the production example of Comparative Example 1, a supporting electrode was formed by screen printing using a paste including a metal material. In the production examples of Example 1-1 and Comparative Example 1, the same size, shape, and firing conditions were used except for the supporting electrodes.

One hundred samples of each of Example 1-1 and Comparative Example 1 were evaluated for the discharge responsivity to ESD between discharge electrodes. The discharge responsivity to ESD was measured using an electrostatic discharge immunity test provided in IEC61000-4-2, which is the standard of IEC. When a voltage of about 2 kV to about 8 kV was applied through contact discharge, whether or not discharge was generated between the discharge electrodes of the samples was measured.

Table 1 shows the comparison results.

TABLE 1

Table 1 Comparison of supporting electrode structures

| | Discharge responsivity to ESD | | | | |
|---|---|---|---|---|---|
| | 1 kV | 2 kV | 4 kV | 6 kV | 8 kV |
| Comparative Example 1 | — | — | — | D | D |
| Example 1 | D | D | D | D | D |

In Table 1, "D" indicates that discharge was generated between the discharge electrodes of the samples and the ESD protection function occurred.

As is clear from Table 1, the discharge responsivity to ESD is significantly better in Example 1-1 in which the supporting electrode material is dispersed in the cavity than in Comparative Example 1 in which the supporting electrode including the metal material dispersed therein is formed so as to be adjacent to the cavity. Therefore, the ESD protection characteristics are improved in Example 1-1.

Modification 1-1

A Modification 1-1 of a preferred embodiment of the present invention will be described with reference to FIGS. 7 and 8.

Modification 1-1 is a modification of Example 1-1. Hereinafter, the same elements and components as those in Example 1-1 are designated by the same reference numerals, and the differences between Example 1-1 and Modification 1-1 will be primarily described.

Figure 7:
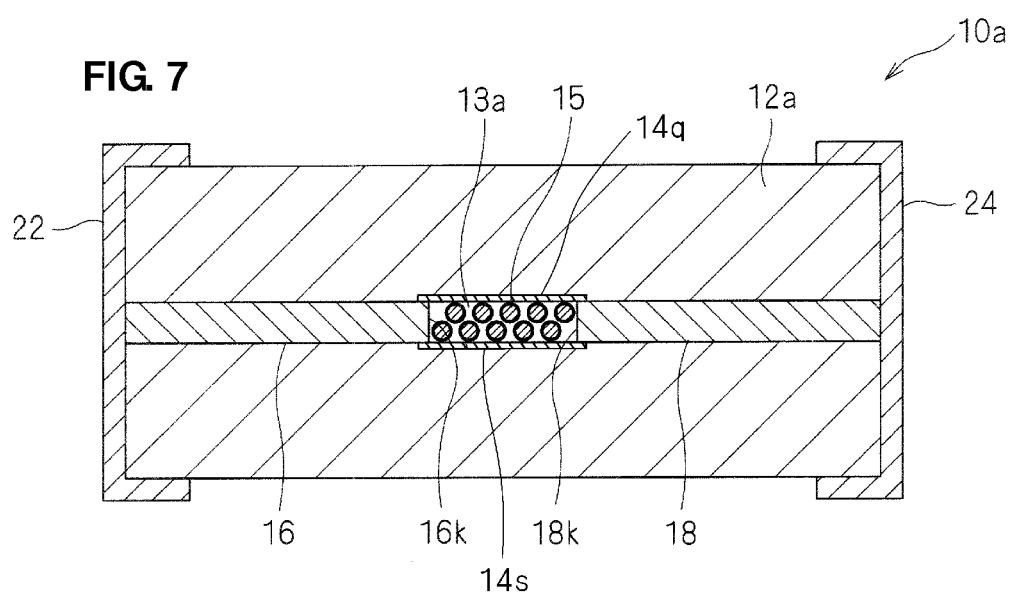
FIG. 7 is a sectional view of an ESD protection device according to another preferred embodiment of the present invention.

FIG. 7 is a sectional view of an ESD protection device 10a of Modification 1-1. FIG. 8 is an enlarged sectional view of a principal portion that shows a cavity 13a of the ESD protection device 10a of Modification 1-1.

Figure 8:
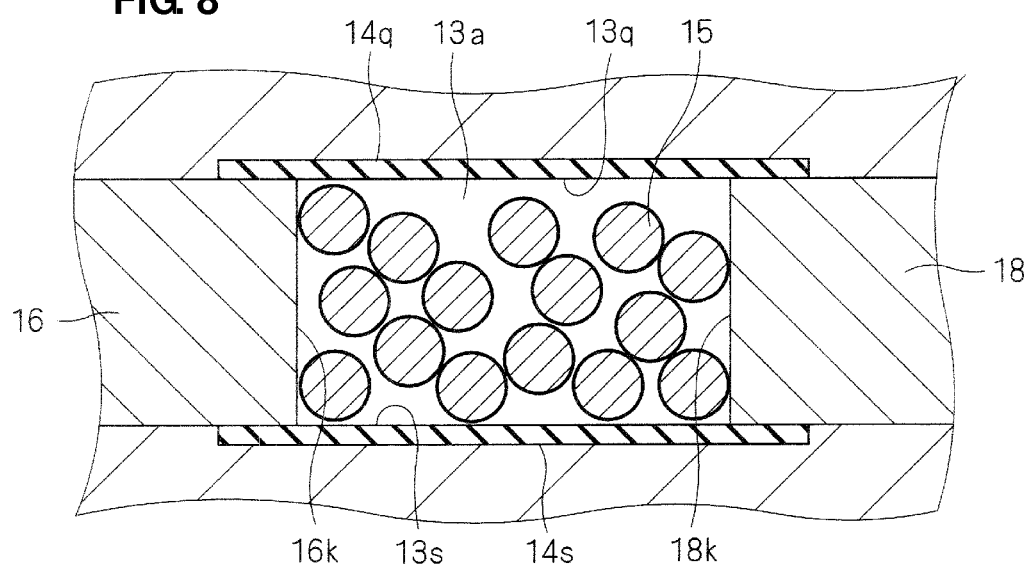
FIG. 8 is an enlarged sectional view of a cavity in the ESD protection device shown in FIG. 7.

As shown in FIGS. 7 and 8, in the ESD protection device 10a of Modification 1-1, the height of the cavity 13a including a supporting electrode material dispersed therein is substantially equal to the thickness of the discharge electrodes 16 and 18. In other words, a sealing member 14q that defines a top surface 13q of the cavity 13a extends so as to have a planar shape.

Creeping discharge is most easily generated in the boundary portion between the ceramic substrate body 12 and the supporting electrode. In the ESD protection device 10a of Modification 1-1, by reducing the height of the cavity 13a, the distance of the boundary portion that connects the discharge electrodes 16 and 18 is decreased. Thus, the ESD protection characteristics are further improved.

Example 1-2

An ESD protection device of an Example 1-2 of a preferred embodiment of the present invention will be described with reference to FIGS. 9 and 10.

The ESD protection device of Example 1-2 has substantially the same configuration as that of the ESD protection device 10 of Example 1-1. Hereinafter, the same elements and components as those in Example 1-1 are designated by the same reference numerals, and the differences between Example 1-1 and Example 1-2 will be primarily described.

Figure 9:
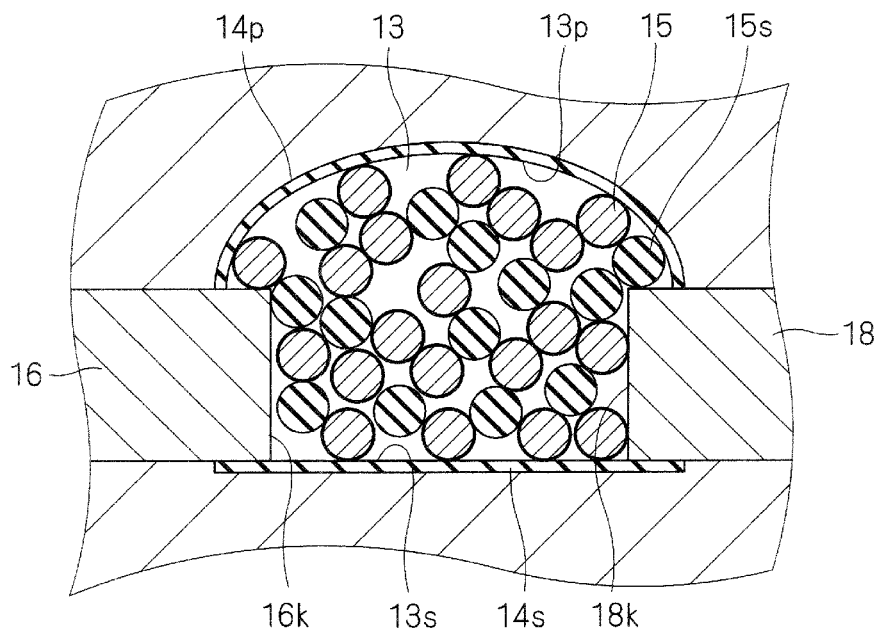
FIG. 9 is an enlarged sectional view of a cavity according to a preferred embodiment of the present invention.
Figure 10:
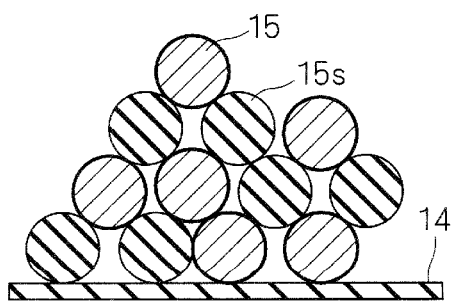
FIG. 10 is a conceptual diagram after a supporting electrode is formed in the ESD protection device shown in FIG. 9.

FIG. 9 is an enlarged sectional view of a principal portion of a cavity 13. As shown in FIG. 9, the ESD protection device of Example 1-2 is different from the ESD protection device 10 of Example 1-1 in that, in addition to the supporting electrode particles 15 including a supporting electrode material, insulating particles 15s are dispersed in the cavity 13. That is, the supporting electrode includes a mixture of the supporting electrode particles 15 and the insulating particles 15s. The particles 15 and 15s that are disposed in the cavity and that define the supporting electrode need to be not sintered with each other and, thus, have an insulating property.

The supporting electrode material included in the supporting electrode particles 15 is preferably at least one metal selected from transition metals, such as Cu, Ni, Co, Ag, Pd, Rh, Ru, Au, Pt, and Ir, for example. These metals may be used alone or in a form of an alloy. Furthermore, a metal oxide of these metals may be used. Alternatively, a semiconductor material, such as SiC, for example, may be used as the supporting electrode material of the supporting electrode particles. Metal particles and semiconductor particles may be used in a mixed manner.

In Example 1-2, since an insulating property of the discharge electrodes can be ensured by disposing the insulating particles 15s between the supporting electrode particles 15, the supporting electrode particles 15 may include only a supporting electrode material having conductivity.

Supporting electrode particles obtained by coating the surface of a supporting electrode material with an insulating material are preferably used because the insulation reliability of discharge electrodes is improved. To prevent the sintering of conductive powder, an inorganic material, such as $Al_2O_3$, $ZrO_2$, or $SiO_2$, a mixed calcined material such as BAS, or a coating material having an insulating property such as high melting point glass, for example, is preferably used as the insulating material that coats the supporting electrode material.

Any insulating particles may be used as the insulating particles 15s as long as the insulating particles are not sintered with the supporting electrode particles 15 and also are not sintered with each other. For example, the insulating particles 15s are preferably made of an inorganic material, such as ceramic powder, for example, $Al_2O_3$, $ZrO_2$, or $SiO_2$ having a sintering temperature greater than the firing temperature of a substrate.

A method for manufacturing the ESD protection device of Example 1-2 will now be described.

A ceramic green sheet for forming a substrate body, an electrode paste for forming discharge electrodes, and a sealing member-forming paste for forming a sealing member are prepared by the same or substantially the same method as in Example 1-1.

A sealing member is formed on a ceramic green sheet using the sealing member-forming paste by the same or substantially the same method as in Example 1-1.

Discharge electrodes are formed on the ceramic green sheet using the electrode paste by the same or substantially the same method as in Example 1-1.

A supporting electrode formation layer is formed by screen printing or xerography on the green sheet on which the sealing member and the discharge electrodes have been formed.

In the case of screen printing, a paste including supporting electrode particles and insulating particles is prepared, and a supporting electrode formation layer is formed using the prepared paste by the same or substantially the same method as in Example 1-1.

The paste including the supporting electrode particles and the insulating particles is prepared by the following method.

Cu powder coated with alumina and having an average particle size of about 5 µm, for example, and alumina powder are prepared in a desired ratio. A binder resin and a solvent are added thereto and then stirred and mixed using a roll mill to obtain the paste. The ratio of the Cu powder coated with alumina to the alumina powder is preferably set to 1:1 by volume, for example. The content of the resin and the solvent in the paste is preferably set to about 40 wt %, for example. The Cu powder coated with alumina and the alumina powder are not sintered during firing. That is, necking is not caused. The Cu powder coated with alumina and the alumina powder maintain an insulating property even after firing.

In the case in which the supporting electrode is formed by xerography, a toner including supporting electrode particles and insulating particles is prepared, and then a supporting electrode formation layer is formed using the prepared toner by the same or substantially the same method as in Example 1-1.

The toner including the supporting electrode particles and the insulating particles is prepared by the following method.

1. Cu powder coated with alumina having an average particle size of about 5 µm and a resin are mixed with each other, and the surface of the Cu powder is covered with the resin using a surface-treating machine.

2. The sample obtained through the process 1 is classified to remove fine powder and coarse powder.

3. The capsulated Cu powder obtained through the process and an external additive are mixed with each other, and the external additive is uniformly attached to the surface of the capsulated Cu powder using a surface-treating machine.

4. The capsulated Cu powder obtained through the process 3 and a carrier are mixed with each other to obtain a developer.

5. An alumina powder toner prepared in the same procedure is mixed with the Cu powder toner in a ratio of 1:1 by volume.

The ceramic green sheets are laminated and press-bonded with each other by the same or substantially the same method as in Example 1-1 to form a laminated body.

By the same method as in Example 1-1, the laminated body is cut into chips and external electrodes are formed.

Each of the chips having the external electrodes formed thereon is fired by the same or substantially the same method as in Example 1-1.

Electrolytic Ni plating and Sn plating are performed on the external electrodes of the fired chip in the same or substantially the same manner as in Example 1-1 to complete an ESD protection device.

In the ESD protection device of Example 1-2, the ESD protection characteristics are improved due to the supporting electrode particles 15 as in Example 1-1.

Furthermore, in the ESD protection device of Example 1-2, by adding the insulating particles 15s, such as a insulating green ceramic material, the insulation reliability of the supporting electrode is further improved as compared to in Example 1-1.

Modification 1-2

Figure 11:
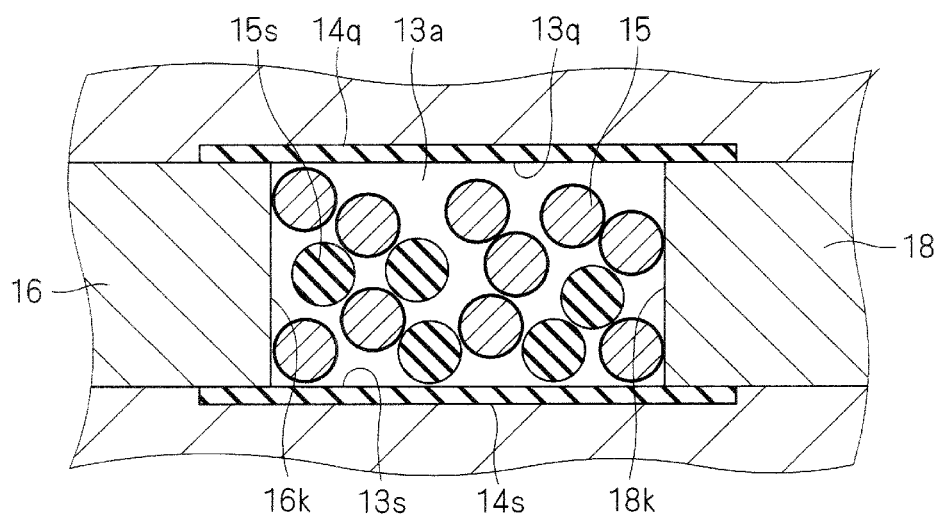
FIG. 11 is an enlarged sectional view of a cavity according to another preferred embodiment of the present invention.

A Modification 1-2 of a preferred embodiment of the present invention will be described with reference to FIG. 11.

Modification 1-2 is a modification of Example 1-2. In the ESD protection device of Modification 1-2, as shown in an enlarged sectional view of a principal portion of FIG. 11, the height of a cavity 13a including supporting electrode particles 15 and insulating particles 15s dispersed therein is substantially equal to the thickness of discharge electrodes 16 and 18. In other words, a sealing member 14q that defines a top surface 13q of the cavity 13a extends so as to form a planar shape.

Creeping discharge is most easily generated in the boundary portion between the ceramic substrate body 12 and the discharge electrodes 16 and 18. In the ESD protection device of Modification 1-2, by reducing the height of the cavity 13a, the distance of the boundary portion that connects the discharge electrodes 16 and 18 is decreased. Thus, creeping discharge is more easily generated than in Example 1-2 and the ESD protection characteristics are further improved.

Example 1-3

An ESD protection device of an Example 1-3 of a preferred embodiment of the present invention will be described with reference to FIG. 12.

The ESD protection device of Example 1-3 has substantially the same configuration as that of the ESD protection device 10 of Example 1-1. Hereinafter, the same elements and components as those in Example 1-1 are designated by the same reference numerals, and the differences between Example 1-1 and Example 1-3 will be primarily described.

Figure 12:
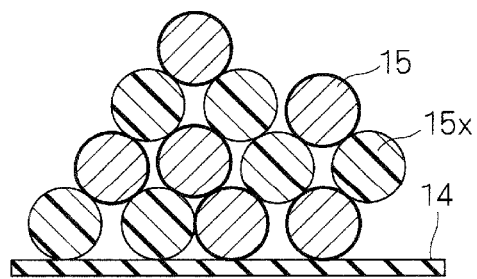
FIG. 12 is a conceptual diagram after a supporting electrode is formed in the ESD protection device shown in FIG. 11.

FIG. 12 is a conceptual diagram of a cavity including a supporting electrode formation layer formed therein before firing. As shown in FIG. 12, the ESD protection device of Example 1-3 is different from the ESD protection device 10 of Example 1-1 in that, in addition to the supporting electrode particles 15 including a supporting electrode material, elimination particles 15x to be eliminated after firing are disposed on a sealing member 14. In other words, a supporting electrode formation layer includes a mixture of the supporting electrode particles 15 and the elimination particles 15x, and after firing, the supporting electrode particles 15 are dispersed in the cavity.

A method for manufacturing the ESD protection device of Example 1-3 will now be described.

A ceramic green sheet for forming a substrate body, an electrode paste for forming discharge electrodes, and a sealing member-forming paste for forming a sealing member are prepared by the same or substantially the same method as in Example 1-1.

A sealing member is formed on a ceramic green sheet using the sealing member-forming paste by the same or substantially the same method as in Example 1-1.

Discharge electrodes are formed on the ceramic green sheet using the electrode paste by the same or substantially the same method as in Example 1-1.

A supporting electrode formation layer is formed by screen printing or xerography on the green sheet on which the sealing member and the discharge electrodes have been formed.

In the case of screen printing, a paste including supporting electrode particles and elimination particles is prepared, and a supporting electrode formation layer is formed using the prepared paste by the same or substantially the same method as in Example 1-1.

The paste including the supporting electrode particles and the elimination particles is prepared by the following method.

1. Cu powder coated with alumina and having an average particle size of about 5 μm, for example, and acrylic resin beads are prepared in a desired ratio. A binder resin and a solvent are added thereto and then stirred and mixed using a roll mill to obtain the paste.

2. The ratio of the Cu powder to the acrylic resin beads is set to about 1:1 by volume, for example.

3. The content of the resin and the solvent in the paste is set to about 40 wt %, for example.

4. The Cu powder coated with alumina is supporting electrode particles and maintains an insulating property even after firing.

5. The acrylic resin beads define elimination particles that are to be eliminated during firing.

In the case in which a supporting electrode is formed by xerography, a toner including supporting electrode particles and elimination particles is prepared, and then a supporting electrode formation layer is formed using the prepared toner by the same or substantially the same method as in Example 1-1.

The toner including the supporting electrode particles, the insulating particles, and the elimination particles is prepared by the following method.

1. Cu powder coated with alumina having an average particle size of about 5 μm, for example, which is supporting electrode particles, and a resin are mixed with each other, and the surface of the Cu powder is covered with the resin using a surface-treating machine.

2. The sample obtained through the process 1 is classified to remove fine powder and cohered powder.

3. The capsulated Cu powder obtained through the process and an external additive are mixed with each other, and the external additive is uniformly attached to the surface of the capsulated Cu powder using a surface-treating machine.

4. The capsulated Cu powder obtained through the process 3 and a carrier are mixed with each other to obtain a toner, which is a developer.

5. A toner including the acrylic resin beads, which are elimination particles, is prepared in the same procedure, and mixed with the toner containing the Cu powder coated with alumina in a ratio of about 1:1 by volume, for example.

By the same or substantially the same method as in Example 1-1, the laminated body is cut into chips and external electrodes are formed.

Each of the chips having the external electrodes formed thereon is fired by the same or substantially the same method as in Example 1-1.

Electrolytic Ni plating and Sn plating are performed on the external electrodes of the fired chip in the same or substantially the same manner as in Example 1-1 to complete an ESD protection device.

The average particle size of the resin beads is preferably in a range of about 0.05 μm to about 10 μm, and more preferably about 1 μm to about 5 μm, for example. The elimination particles are not necessarily composed of a resin and may be composed of carbon or other suitable material, as long as the elimination particles are eliminated during firing.

In the supporting electrode formation layer, which is a mixture of supporting electrode particles and resin beads, the particles need to be not sintered with each other and thus have an insulating property.

The supporting electrode material included in the supporting electrode particles is preferably at least one metal selected from transition metals, such as Cu, Ni, Co, Ag, Pd, Rh, Ru, Au, Pt, and Ir, for example. These metals may be used alone or in a form of an alloy. Furthermore, a metal oxide of these metals or a semiconductor material, such as SiC, for example, may be used. Metal particles and semiconductor particles may be used in a mixed arrangement.

The supporting electrode particles need only include a supporting electrode material. However, to prevent the sintering of the supporting electrode material, the supporting electrode material is preferably coated with an inorganic material, such as $Al_2O_3$, $ZrO_2$, or $SiO_2$, a mixed calcined material such as BAS, or a coating material having an insulating property such as high melting point glass, for example.

In the ESD protection device of Example 1-3, the ESD protection characteristics is improved due to the supporting electrode particles 15 as in Example 1-1.

In the ESD protection device of Example 1-3, the added resin beads prevent the particles of a discharge supporting electrode from contacting each other and, thus, from sintering with each other (necking). Consequently, the insulation reliability of the discharge supporting electrode is further improved as compared to in Example 1-1.

Even if the elimination particles are eliminated, the supporting electrode particles and the insulating particles are in contact with each other in the cavity because the ceramic substrate body is shrunk after firing and the size of the cavity is decreased. As a result, a gap having a proper size is formed.

Example 1-4

An Example 1-4 of a preferred embodiment of the present invention will be described with reference to FIGS. 13A to 13D.

FIGS. 13A to 13D are conceptual diagrams of a cavity having a supporting electrode formation layer provided therein before firing. Example 1-4 is different from Examples 1-1 to 1-3 in a manner in which particles are disposed in a cavity.

Figure 13A:
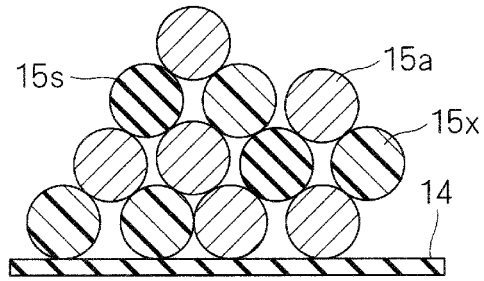
FIGS. 13A to 13D are conceptual diagrams after a supporting electrode is formed according to various preferred embodiments of the present invention.

In the example shown in FIG. 13A, Cu particles 15a, which are supporting electrode particles including a conductive material, alumina particles 15s, which are insulating particles, and acrylic resin beads 15x, which are elimination particles, are preferably dispersed on an alumina sealing member 14.

Figure 13B:
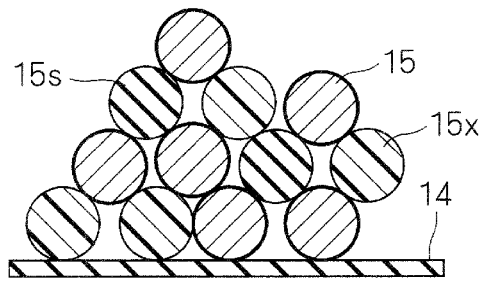

In the example shown in FIG. 13B, Cu particles 15 coated with alumina, which are supporting electrode particles obtained by coating the surface of a conductive material with an insulating material, alumina particles 15s, which are insulating particles, and acrylic resin beads 15x, which are elimination particles, are preferably dispersed on an alumina sealing member 14.

Figure 13C:
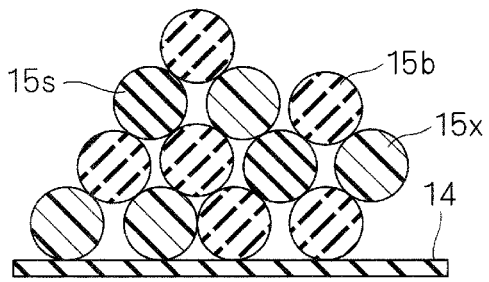

In the example shown in FIG. 13C, SiC particles 15b, which are supporting electrode particles including a semiconductor material, alumina particles 15s, which are insulating particles, and acrylic resin beads 15x, which are elimination particles, are preferably dispersed on an alumina sealing member 14.

Figure 13D:
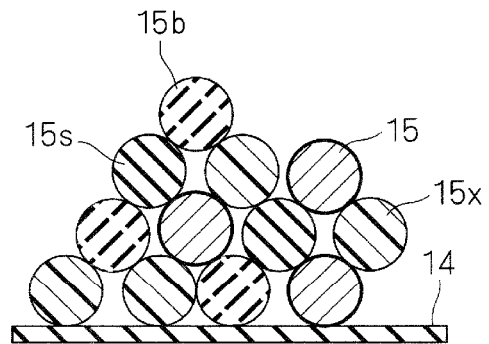

In the example shown in FIG. 13D, Cu particles 15 coated with alumina, which are supporting electrode particles obtained by coating the surface of a conductive material with an insulating material, SiC particles 15b, which are supporting electrode particles including a semiconductor material, alumina particles 15s, which are insulating particles, and acrylic resin beads 15x are preferably dispersed on an alumina sealing member 14.

The supporting electrode formation layer in which particles are disposed as shown in FIGS. 13A to 13D can be formed by combining the production method of Example 1-2 with that of Example 1-3.

In the ESD protection device of Example 1-4, the ESD protection characteristics are improved due to the supporting electrode particles 15 as in Example 1-1.

Furthermore, in the ESD protection device of Example 1-4, by adding the insulating particles, the insulation reliability of the supporting electrode is further improved as compared to Example 1-1.

In the ESD protection device of Example 1-4, the added resin beads prevent the particles of a discharge supporting electrode from contacting each other and, thus, from sintering with each other (necking). Consequently, the insulation reliability of the discharge supporting electrode is further improved as compared to Example 1-1.

Example 1-5

An ESD protection device of an Example 1-5 of a preferred embodiment of the present invention will be described with reference to FIGS. 14A and 14B.

An ESD protection device of Example 1-5 is different from those of Examples 1-1 to 1-4 in that the substrate body is a resin substrate.

A method for manufacturing the ESD protection device of Example 1-5 will be described with reference to an exploded sectional view of FIGS. 14A and 14B.

A substrate A shown in FIG. 14A is prepared. That is, discharge electrodes 16a and 18a are formed by stacking Cu foil on a prepreg 11s and patterning the Cu foil through photolithography.

A substrate B schematically shown in FIG. 14B is prepared. That is, a toner 60 including supporting electrode particles is disposed on a prepreg 11t by xerography as in Example 1-1.

As indicated by an arrow 88, the substrate A, which is completely cured, is disposed on the substrate B, which is semi-cured, and they are bonded to each other through the complete cure of the substrate B. A cavity is formed between an edge 16t of the discharge electrode 16a and an edge 18t of the discharge electrode 18a by the thickness of the Cu foil of the substrate A. The toner including supporting electrode particles is disposed in the cavity.

Note that, after the substrate B is completely cured, the substrate A and the substrate B may be bonded to each other using an adhesive.

A baking electrode or a conductive resin electrode is formed on the end surfaces of the bonded substrate, and plating is performed thereon to obtain external electrodes.

Through the processes described above, the ESD protection device of Example 1-4 is completed.

In the ESD protection device of Example 1-4, the ESD protection characteristics is improved due to the toner 60 including supporting electrode particles as in Example 1-1.

In the ESD protection device of Example 1-4, the sealing member included in the ESD protection device of Example 1-1 is unnecessary because glass does not enter the cavity from the resin substrate body.

Example 2-1

Figure 18:
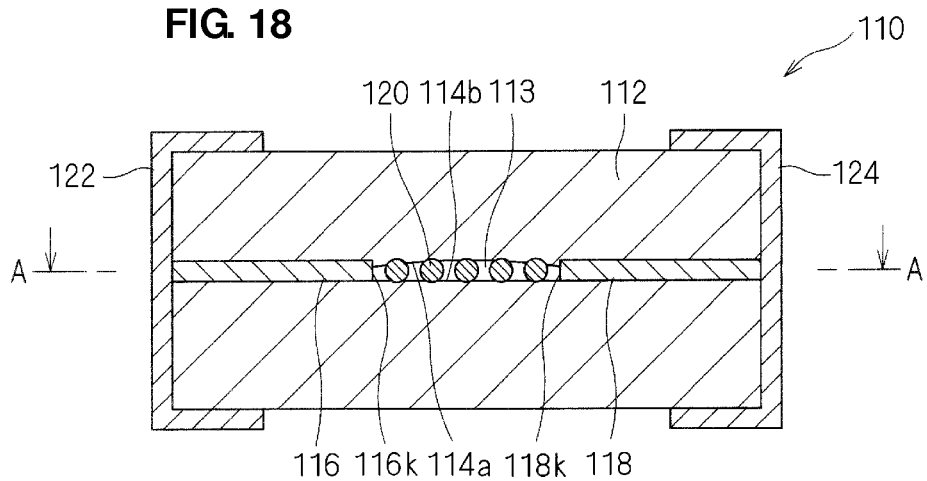
FIG. 18 is a sectional view of an ESD protection device according to another preferred embodiment of the present invention.
Figure 19:
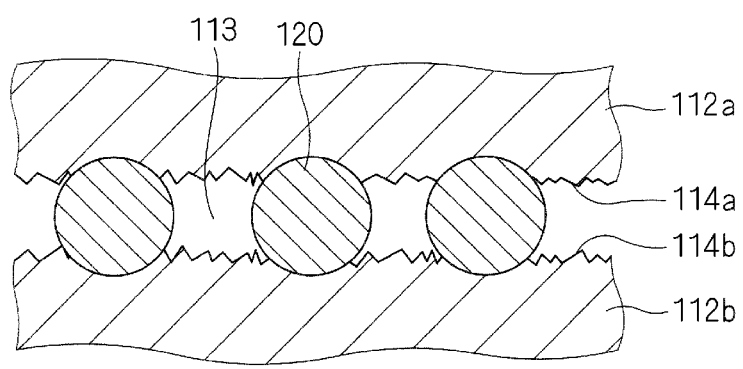
FIG. 19 is an enlarged sectional view of a principal portion of the ESD protection device shown in FIG. 18.
Figure 20:
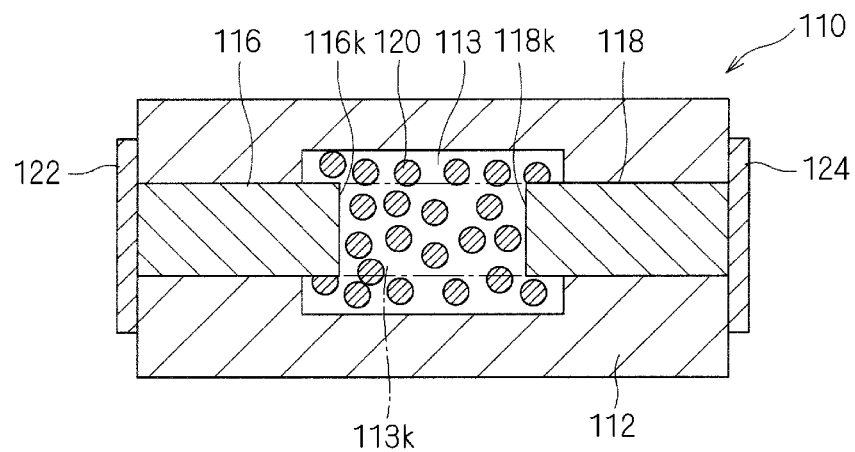
FIG. 20 is a sectional view taken along line A-A of FIG. 18.

An ESD protection device 110 of an Example 2-1 of a preferred embodiment of the present invention will be described with reference to FIGS. 18 to 20. FIG. 18 is a sectional view of an ESD protection device 110. FIG. 19 is an enlarged sectional view of a principal portion that shows a cavity 113 of the ESD protection device 110. FIG. 20 is a sectional view taken along line A-A of FIG. 18.

As shown in FIGS. 18 to 20, the ESD protection device 110 preferably includes a cavity 113 provided in a substrate body 112 of a ceramic multilayer substrate. A pair of discharge electrodes 116 and 118 are disposed such that the respective edges 116k and 118k are exposed in the cavity 113. The discharge electrodes 116 and 118 extend to the peripheral surface of the substrate body 112 and are respectively connected to external electrodes 122 and 124 provided on the surface of the substrate body 112. The external electrodes 122 and 124 are used to connect the ESD protection device 110 to a device.

As shown in FIGS. 18 to 20, the discharge electrodes 116 and 118 are arranged so that the edges 116k and 118k exposed in the cavity 113 face each other with a space provided therebetween.

As schematically shown in FIGS. 18 to 20, a conductive material 120 is disposed in the cavity 113. The conductive material 120 is sandwiched between a top surface 114a and a bottom surface 114b that define the cavity 113. The conductive material 120 is preferably a powdery material and is dispersed in the cavity 113. The portion in which the conductive material 120 is disposed, which may be referred to as "supporting electrode", has an insulating property.

The conductive material 120 is preferably at least one metal selected from transition metals, such as Cu, Ni, Co, Ag, Pd, Rh, Ru, Au, Pt, and Ir, for example. These metals may be used alone or in a form of an alloy. Furthermore, a metal oxide of these metals or a semiconductor material, such as SiC, for example, may be used.

The above-described metals coated with an inorganic material, such as $Al_2O_3$, $ZrO_2$, or $SiO_2$ or a mixed calcined material such as a BAS material specifically described below, for example, may be used instead of the conductive material 120. Alternatively, the above-described metals coated with an organic material, such as a resin, for example, may be used instead of the conductive material 120. By using such coated powder, the contact between particles of the conductive material is prevented and the short-circuit resistance is improved.

In the ESD protection device 110, when a voltage equal to or greater than a certain voltage is applied between the external electrodes 122 and 124, discharge is generated between the discharge electrodes 116 and 118 that face each other in the cavity 113. Since the conductive material 120 is in contact with the top surface 114a and the bottom surface 114b that define the cavity 113, electrons easily move and, thus, a discharge phenomenon can be more efficiently produced.

In other words, the discharge phenomenon that occurs between the discharge electrodes 116 and 118 is primarily creeping discharge that is generated along the interface between a gas phase of the cavity 113 and the substrate body 112, which is an insulator, that is, along an inner circumferential surface including the top surface 114a and the bottom surface 114b that define the cavity 113. Creeping discharge is a discharge phenomenon in which current flows along a surface of a material (insulator). Although it has been described that electrons flow, it is believed that, in reality, the electrons move by hopping along the surface and ionizing the gas. It is also believed that the presence of conductive powder on the surface of an insulator decreases the apparent distance which the electrons hop and imparts directionality to the electrons, thereby generating creeping discharge more actively.

If discharge is efficiently generated between the discharge electrodes 116 and 118, the distance between the discharge electrodes 116 and 118 can be decreased. The fluctuation in responsivity to ESD caused by variations in the distance between the discharge electrodes 116 and 118 can also be reduced. Thus, stable responsivity to ESD is achieved.

Since the conductive material 120 is in contact with the top surface 114a and the bottom surface 114b that define the cavity 113, the conductive material 120 is not detached from the substrate body 112 due to the impact during discharge. Therefore, the ESD discharge characteristics are not degraded after repetitive discharges. In addition, since a portion of the conductive material 120 is buried in insulating layers 112a and 112b of the substrate body 112 as shown in FIG. 19, detachment of the conductive material 120 is further prevented with certainty.

Furthermore, since the conductive material 120 is in contact with both the top surface 114a and the bottom surface 114b that define the cavity 113, creeping discharge is easily generated along both the top surface 114a and the bottom surface 114b. Therefore, the area in which creeping discharge is generated is approximately doubled as compared to the case in which a conductive material is dispersed on only the bottom surface as in Comparative Example 2 described below. As a result, creeping discharge is more easily generated and, thus, the ESD discharge characteristics are further improved.

A method for manufacturing the ESD protection device 110 will now be described.

First, materials for forming a substrate body 112, a cavity 113, a conductive material 120, and discharge electrodes 116 and 118 are prepared.

A ceramic green sheet for forming the substrate body 112 is prepared as follows.

A material primarily including Ba, Al, and Si (BAS material) is used as a ceramic material. Raw materials are prepared and mixed so that the mixture has a desired composition, and then calcined at about 800° C. to about 1000° C. The calcined powder is pulverized using a zirconia ball mill for about 12 hours to obtain ceramic powder. An organic solvent, such as toluene or EKINEN, for example, is added to the BAS material-calcined ceramic powder and mixed. A binder and a plasticizer are further added thereto and mixed to obtain slurry. The obtained slurry is molded on a PET film by a doctor blade method to obtain a ceramic green sheet having a thickness of about 50 μm, for example.

The ceramic material is not particularly limited to the above-described material as long as the ceramic material has an insulating property. Therefore, such a ceramic material may be a mixture of forsterite and glass, a mixture of $CaZrO_3$ and glass, or other suitable material, for example.

A toner for forming a supporting electrode, which is chargeable powder including a conductive material 120 to be disposed in the cavity 113, is prepared as follows.

1. Surface copper oxide powder having an average particle size of about 14 μm, for example, and an acrylic resin are preferably mixed with each other, and the surface of the Cu powder is covered with the resin using a surface-treating machine.

2. The sample obtained through the process 1 is classified using a classifier to remove fine powder and coarse powder.

3. The composite powder obtained by coating the surface of copper with the acrylic resin through the process 2 is dispersed in an aqueous solution in which a dispersant is dissolved. After the composite powder is precipitated, the supernatant liquid is removed and the composite powder is dried in a vacuum drying oven.

4. The composite powder obtained through the process 3 and an external additive (silica powder) are mixed with each other, and the external additive is uniformly attached to the surface of the composite powder using a surface-treating machine to obtain a toner for forming a supporting electrode.

The conductive material defining the toner for forming a supporting electrode is preferably at least one metal selected from transition metals, such as Cu, Ni, Co, Ag, Pd, Rh, Ru, Au, Pt, and Ir, for example. These metals may be used alone or in a form of an alloy. Furthermore, a metal oxide of these metals, a semiconductor material such as SiC, or a resistive material, for example, may be used.

The average particle size of the toner for forming a supporting electrode is preferably about 3 μm to about 30

μm, and more preferably about 5 μm to about 20 μm, for example. When the average particle size of the toner for forming a supporting electrode is about 20 μm or less, the toner can be easily dispersed so as not to cause short circuits between discharge electrodes. When the average particle size of the toner for forming a supporting electrode is about 5 μm or more, the distance between ceramic layers that sandwich the toner for forming a supporting electrode in a vertical direction can be satisfactorily ensured, and thus, the gap between the upper and lower ceramic layers is prevented from being filled with glass during firing.

For the toner for forming a supporting electrode, the content of the conductive material is preferably about 10 wt % to about 95 wt %, and more preferably about 30 wt % to about 70 wt %, for example. When the content of the conductive material is about 95 wt % or less, the degradation of chargeability caused when the conductive material is exposed on the surface due to an insufficient amount of resin in the toner is easily prevented. When the content of the conductive material is about 10 wt % or more, discharge is easily and efficiently generated by the supporting electrode.

The resin that coats the toner is preferably a resin that has good charging characteristics and is eliminated through combustion, decomposition, fusion, and vaporization when fired so that the surface of the conductive material is exposed. Examples of the resin include acrylic resins, styrene-acrylic resins, polyolefin resins, polyester resins, polypropylene resins, and butyral resins. Herein, the resin is not necessarily completely eliminated, and a resin having a thickness of about 10 nm may remain.

A toner for forming a cavity, which is chargeable powder for forming the cavity 113, is prepared by mixing acrylic beads having an average particle size of about 15 μm, for example, and an external additive with each other and then uniformly attaching the external additive to the surface of the acrylic beads using a surface-treating machine.

The resin material defining the toner for forming a cavity is preferably at least one resin selected from resins that are eliminated through combustion, such as acrylic reins, styrene-acrylic resins, polyolefin resins, polyester resins, and butyral resins and resins that are decomposed into monomers at high temperature, for example. These resins can be used alone or in combination.

The average particle size of the toner for forming a cavity is preferably about 3 μm to about 30 μm, and more preferably about 5 μm to about 20 μm, for example. When the average particle size of the toner for forming a cavity is about 20 μm or less, a large void is not formed after firing even if the toner for forming a cavity is scattered onto a background portion other than the pattern. When the average particle size of the toner for forming a cavity is about 5 μm or more, the distance between ceramic layers that sandwich the toner for forming a supporting electrode in a vertical direction can be satisfactorily ensured, and thus, the gap between the upper and lower ceramic layers is prevented from being filled with glass during firing.

The particle size of the toner for forming a cavity is preferably equal or substantially equal to that of the toner for forming a supporting electrode.

The material defining the toner for forming a cavity is preferably eliminated at a temperature less than or equal to the temperature (about 600° C. to about 700° C.) at which glass in a ceramic flows. In the case in which glass flows after the toner for forming a cavity is eliminated and a cavity is formed, the conductive material can be secured and the surface roughness of the creepage surface can be decreased.

In contrast, when the material defining the toner for forming a cavity is eliminated at a temperature greater than or equal to the temperature (about 600° C. to about 700° C.) at which glass in a ceramic flows, the cavity is prevented from being filled with glass that oozes out from a ceramic layer. In this case, for example, carbon can be used as the material that defines the toner for forming a cavity and is to be eliminated.

A discharge electrode paste for forming the discharge electrodes 116 and 118 is prepared as follows. A sample obtained by adding a solvent to about 80 wt % Cu powder having an average particle size of about 2 μm and a binder resin composed of ethyl cellulose or other suitable resin is stirred and mixed.

The conductive material defining the discharge electrode paste is preferably at least one metal selected from transition metals, such as Cu, Ni, Co, Ag, Pd, Rh, Ru, Au, Pt, and Ir, for example. These metals may be used alone or in a form of an alloy. Furthermore, a metal oxide of these metals may be used.

A conductive material is attached to the prepared ceramic green sheet by xerography.

1. The toner for forming a supporting electrode, which includes a conductive material, and the toner for forming a cavity are mixed so as to have a volume ratio of about 1:1, for example.

2. The mixed toner obtained through the process 1 is mixed with a carrier to prepare a transfer toner.

3. A photoconductor is uniformly charged.

4. The charged photoconductor is irradiated with light using an LED in a pattern of a supporting electrode, to form a latent image. In the production example, the supporting electrode preferably had a pattern of about 30 μm×about 100 μm, which was substantially the same size as that of the gap between discharge electrodes.

5. A development bias is applied to develop the transfer toner on the photoconductor.

6. A ceramic green sheet is disposed on the photoconductor on which the pattern of the transfer toner has been developed, to transfer the transfer toner onto the ceramic green sheet.

7. The ceramic green sheet onto which the pattern of the transfer toner has been transferred is inserted into an oven to fix the toner. Thus, a ceramic green sheet in which the toner for forming a supporting electrode, which includes a conductive material, and the toner for forming a cavity are disposed in a region where a cavity is to be formed is obtained.

By transferring onto the ceramic green sheet the transfer toner in which the toner for forming a supporting electrode, which includes a conductive material, and the toner for forming a cavity are uniformly mixed with each other, the distance between particles of conductive material is ensured with certainty and, thus, stable responsivity to ESD are achieved.

For the transfer toner defined by the toner for forming a supporting electrode, which includes a conductive material, and the toner for forming a cavity, the content of the toner for forming a supporting electrode in the transfer toner is preferably about 10% to about 90% by volume, and more preferably about 20% to about 80% by volume, for example. When the content of the toner for forming a supporting electrode in the transfer toner is about 20% or more, satisfactory ESD discharge characteristics is easily achieved due to the conductive material, such as a conductive powder. When the content of the toner for forming a supporting electrode in the transfer toner is about 80% or less, a sufficient size gap is formed between particles of the conductive material, such as a conductive powder, and, thus, short circuits between the discharge electrodes are easily prevented.

In the production example, the size of the supporting electrode pattern in which the transfer toner is disposed was set to be the same or substantially the same as the gap between the discharge electrodes. However, the size may be increased by about 10 μm to about 50 μm to compensate for printing displacement. Alternatively, the size of the discharge electrode pattern may be increased by about 10 μm to 50 μm with respect to the supporting electrode pattern in which the transfer toner is disposed.

Discharge electrodes are formed by screen printing. That is, a discharge electrode pattern is formed by screen printing on the surface of the ceramic green sheet on which the supporting electrode pattern has been transferred using the transfer toner. In the production example, the discharge electrodes were formed so that the width of each of the discharge electrodes was preferably about 100 μm, for example, and the discharge gap between the edges of the discharge electrodes was preferably about 30 μm, for example.

In the production example, the discharge electrode pattern was formed by screen printing, but a publicly known wiring pattern formation method such as xerography, ink jet printing, thermal transfer printing, gravure printing, or direct-writing printing may be suitably used.

Subsequently, the ceramic green sheets are laminated and fired as follows.

1. The discharge electrode pattern is formed on ceramic green sheets on which the pattern needs to be formed.
2. All the ceramic green sheets are laminated and press-bonded to form a laminated body.
3. The laminated body is cut into chips using a die in the same manner as in a chip-type component such as an LC filter. In the production example, the laminated body was cut into chips each preferably having a size of about 1.0 mm×about 0.5 mm, for example.
4. The electrode paste is applied to the end surfaces of each of the chips to form external electrodes.
5. Firing is performed in a N2 atmosphere. In the case in which an inert gas, such as Ar or Ne, for example, is introduced into the cavity to decrease the corresponding voltage to ESD, firing may be performed in an atmosphere of an inert gas, such as Ar or Ne, for example, in a temperature range in which a ceramic material is shrunk and sintered. If the electrode material is not oxidized (e.g., Ag), the firing may be performed in the air.

Since the resin toner for forming a cavity is eliminated during firing, the portion in which the resin toner for forming a cavity was present becomes hollow.

The ceramic material is shrunk during firing, thereby exerting a force that sandwiches the conductive material included in the toner for forming a supporting electrode in a vertical direction. As a result, the conductive material is secured more firmly.

Through the shrinking of the ceramic material during firing, the height of the cavity is decreased to about 60% to about 80% of the height of a portion that is to be the cavity before firing. In other words, the conductive material is engaged and buried in the upper and lower ceramic layers by a shrinkage of about 20% to about 40%, and, thus, securely held by the ceramic layers.

After the firing, Ni plating and Sn plating are performed on the external electrodes to complete an ESD protection device.

By manufacturing an ESD protection device using a ceramic substrate as described above, a cavity and a conductive material sandwiched and dispersed between the top surface and the bottom surface that define the cavity is easily formed.

In the production example, a resin was used for the toner for forming a cavity. However, any material, such as carbon, for example, may be used instead of a resin as long as the material is eliminated during firing.

The width of the region in which the conductive material 120 is disposed may preferably be equal to or less than the width of the discharge electrodes. In the production example, the conductive material 120 is preferably disposed in only a region 113$k$ that is sandwiched between the edges 116$k$ and 118$k$ of the discharge electrodes 116 and 118, the region 113$k$ being indicated by a chain line in FIG. 20. However, as shown in FIG. 20, the conductive material 120 may be disposed in and outside the region 113$k$ indicated by the chain line. Alternatively, the conductive material 120 may be disposed in only a portion of the region 113$k$ indicated by the chain line.

Comparative Example 2

An ESD protection device 110$x$ of a Comparative Example 2 will be described with reference to FIGS. 27 and 28.

Figure 27:
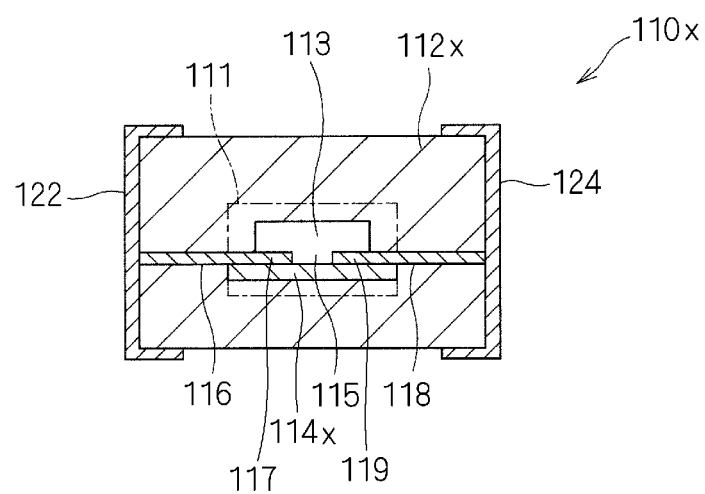
FIG. 27 is a sectional view of an ESD protection device the Comparative Example 2.
Figure 28:
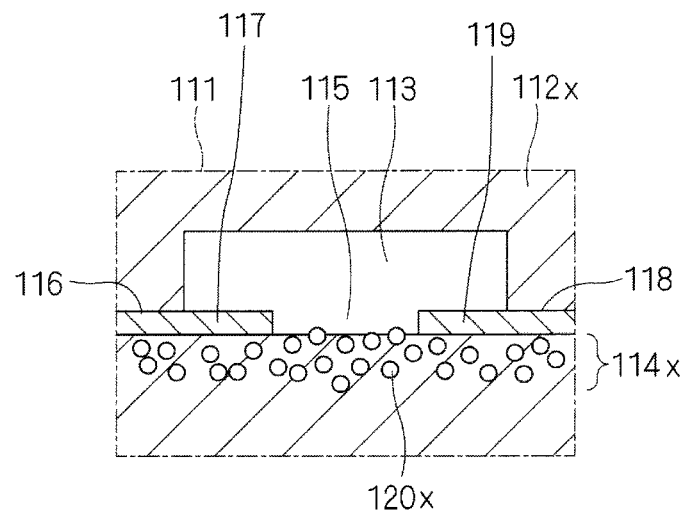
FIG. 28 is an enlarged sectional view of a principal portion of the ESD protection device of the Comparative Example 2.

FIG. 27 is a sectional view of an ESD protection device 110$x$. FIG. 28 is an enlarged sectional view of a principal portion that schematically shows a region 111 indicated by a chain line in FIG. 27.

As shown in FIG. 27, the ESD protection device 110$x$ includes a cavity 113 provided in a substrate body 112$x$ of a ceramic multilayer substrate, such that portions 117 and 119 of discharge electrodes 116 and 118 are exposed in the cavity 113 as in Example 2-1. The discharge electrodes 116 and 118 are respectively connected to external electrodes 122 and 124 provided on a surface of the substrate body 112$x$.

In the ESD protection device 110$x$, unlike in Example 2-1, a supporting electrode 114$x$ is arranged so as to be adjacent to a portion 115 between the discharge electrodes 116 and 118. As shown in FIG. 28, the supporting electrode 114$x$ is a region in which a conductive material 120$x$ is dispersed in an insulating material defining the substrate body 112$x$ and has an insulating property. A portion of the conductive material 120$x$ is exposed in the cavity 113. The supporting electrode 114$x$ is formed by applying a paste for forming a supporting electrode that includes, for example, a ceramic material and a conductive material to a ceramic green sheet.

In the ESD protection device 110$x$, a portion of the conductive material 120$x$ in the supporting electrode 114$x$ is likely to be scattered due to the impact during discharge, whereby the distribution density of the conductive material 120$x$ may be decreased. Therefore, the discharge voltage is gradually increased after repetitive discharges, and the ESD discharge characteristics are degraded.

Figure 23:
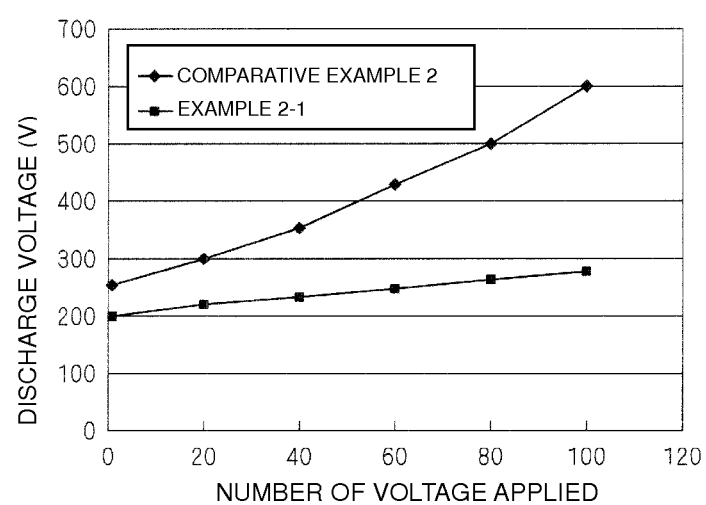
FIG. 23 is a graph showing ESD characteristics of a preferred embodiment of the present invention and a Comparative Example 2.

The ESD protection devices of Comparative Example 2 and Example 2-1, whose substrate body was a ceramic multilayer substrate, were manufactured. The discharge voltage when a voltage of about 8 kV was repeatedly applied was measured for 100 samples of each of Comparative Example 2 and Example 2-1. FIG. 23 shows the measurement results.

As is clear from FIG. 23, by interposing a conductive material between the insulating layers of a substrate body as in Example 2-1, the degradation of ESD characteristics during repetitive discharges is prevented as compared to Comparative Example 2.

It is also clear that the discharge starting voltage of Example 2-1 is less than that of Comparative Example 2, and the ESD discharge characteristics are improved in Example 2-1 as compared to Comparative Example 2.

Modification 2-1

Figure 21:
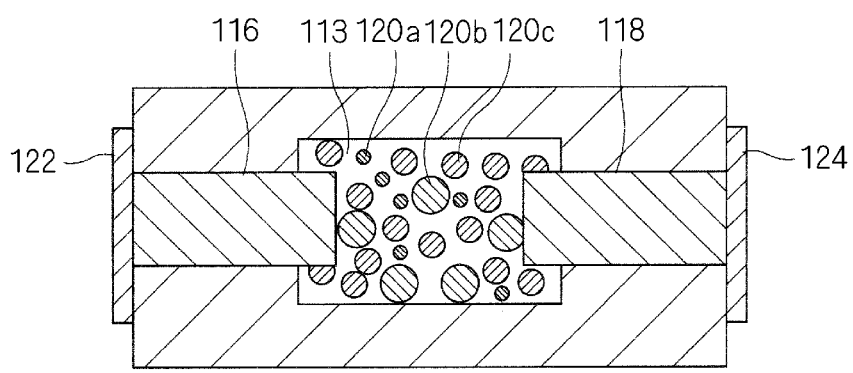
FIG. 21 is a sectional view of an ESD protection device according to another preferred embodiment of the present invention.

As shown in FIG. 21, which is a sectional view similar to FIG. 20, conductive materials 120a, 120b, and 120c having different sizes may preferably be disposed in a cavity 113 in a mixed manner so as to be sandwiched between the top surface and the bottom surface that define the cavity 113.

Modification 2-2

Figure 22:
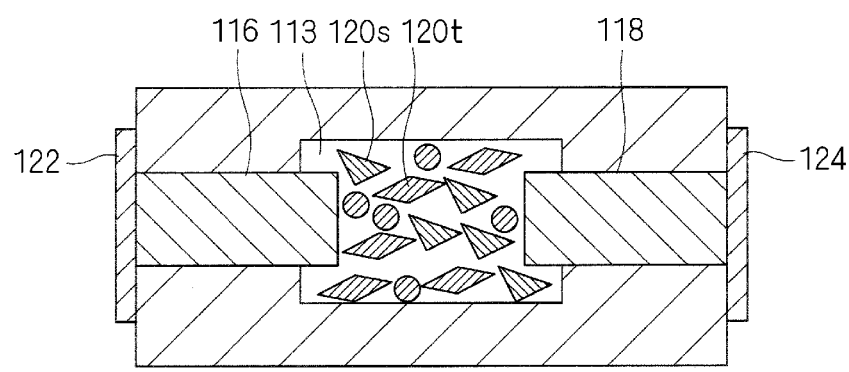
FIG. 22 is a sectional view of an ESD protection device according to another preferred embodiment of the present invention.

As shown in FIG. 22, which is a sectional view similar to FIG. 20, conductive materials 120s and 120t having polygonal shapes may preferably be disposed in a cavity 113 so as to be sandwiched between the top surface and the bottom surface that define the cavity 113.

Example 2-2

Figure 24:
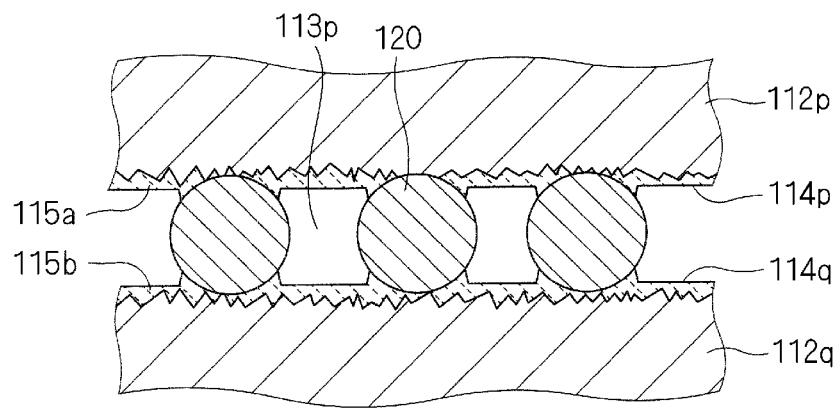
FIG. 24 is an enlarged sectional view of a principal portion of a cavity according to another preferred embodiment of the present invention.

An ESD protection device of an Example 2-2 of a preferred embodiment of the present invention will be described with reference to FIG. 24.

Example 2-2 has substantially the same configuration as Example 2-1. Hereinafter, the same elements and components as those in Example 2-1 are designated by the same reference numerals, and the differences between Example 2-1 and Example 2-2 will be primarily described.

A substrate body of the ESD protection device of Example 2-2 is a ceramic multilayer substrate including a ceramic material and a glass material. As shown in FIG. 24, glass layers 115a and 115b are defined by a glass material that has oozed out from the insulating layers 112p and 112q of a substrate body primarily made of a ceramic material into a cavity 113p during firing. A top surface 114p and a bottom surface 114q that define the cavity 113p are respectively formed of the glass layers 115a and 115b.

The glass layers 115a and 115b can be formed so as to have a desired thickness by adjusting the amount of the glass material that oozes out from the ceramic layers 112p and 112q, the amount being adjusted by controlling the atmosphere, e.g., 02 concentration and $H_2$ concentration, during firing. Since the ESD discharge characteristics are degraded if the entire conductive material 120 is covered with the glass material, the firing atmosphere is preferably adjusted so that only the upper and lower portions of the conductive material 120 are covered with the glass material.

If the glass material excessively oozes out, the cavity is filled with the glass material and the ESD discharge characteristics are degraded. Therefore, the height of the cavity is preferably about 5 μm to about 30 μm.

The amount of the glass material that oozes out can also be adjusted by changing the composition of the ceramic material defining the ceramic layers 112p and 112q that sandwiches the conductive material 120. Glass may be added to the ceramic material actively.

Examples of the glass added include various glasses, such as borosilicate glass, feldspathic crystalline glass, cordierite glass, diopside glass, and lanthanoide titanate glass.

In Example 2-2, advantages equal to or better than those of Example 2-1 are achieved.

That is, since the responsivity to ESD is improved due to the conductive material 120 in contact with the top surface 114p and the bottom surface 114q that define the cavity 113p, ESD characteristics are easily adjusted and stabilized.

Furthermore, the surface roughness of the top surface 114p and the bottom surface 114q that define the cavity 113p is decreased because the top surface 114p and the bottom surface 114q are defined by the glass layers 115a and 115b. Therefore, the distance which electrons move during creeping discharge is decreased, and thus, the responsivity to ESD is further improved.

Since the conductive material 120 is in contact with both the top surface 114p and the bottom surface 114q that define the cavity 113p, the responsivity to ESD can be further improved as compared to the case in which a conductive material is dispersed on only one of the surfaces.

The conductive material 120 is fixed to the substrate body via the glass layers 115a and 115b. Therefore, detachment of the conductive material 120 from the substrate body is more effectively prevented as compared to the case in which the conductive material 120 is merely in contact with the substrate body. Consequently, the degradation of ESD characteristics caused by repetitive discharges, e.g., an increase in discharge starting voltage, is further prevented.

Example 2-3

An ESD protection device 110a of an Example 2-3 of a preferred embodiment of the present invention will be described with reference to FIG. 25.

Figure 25:
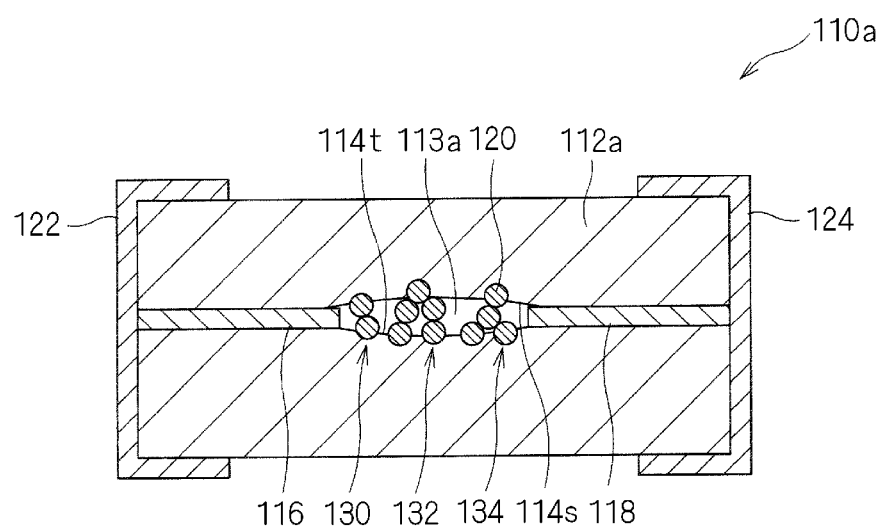
FIG. 25 is a sectional view of an ESD protection device according to another preferred embodiment of the present invention.

As shown in a sectional view of FIG. 25, unlike in Example 2-1, aggregates 130, 132, and 134 of a conductive material are sandwiched between a top surface 114s and a bottom surface 114t that define a cavity 113a. The aggregates 130, 132, and 134 of a conductive material are dispersed in the cavity 113a.

In Example 2-3, the same advantages as in Example 2-1 are achieved.

That is, since the responsivity to ESD is improved due to the aggregates 130, 132, and 134 of a conductive material that are in contact with the top surface 114s and the bottom surface 114t that define the cavity 113a, ESD characteristics are easily adjusted and stabilized.

Since the aggregates 130,132, and 134 of a conductive material are in contact with both the top surface 114s and the bottom surface 114t that define the cavity 113a, the responsivity to ESD is further improved as compared to the case in which the a conductive material is dispersed on only one of the surfaces.

Furthermore, since the aggregates 130, 132, and 134 of a conductive material are in contact with both the top surface 114s and the bottom surface 114t that define the cavity 113a, the detachment of the conductive material from the substrate body 112a is prevented. Consequently, the degradation of ESD characteristics caused by repetitive discharges, e.g., an increase in discharge starting voltage, is prevented.

Example 2-4

An ESD protection device of an Example 2-4 of a preferred embodiment of the present invention will be described with reference to FIGS. 26A and 26B.

An ESD protection device of Example 2-4 is different from that of Example 2-1 in that the substrate body is made of a resin.

A method for manufacturing the ESD protection device of Example 2-4 will be described with reference to an exploded sectional view of FIGS. 26A and 26B.

Figure 26A:
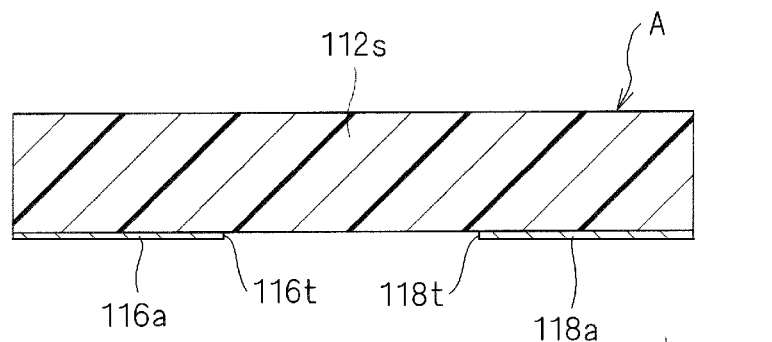
FIGS. 26A and 26B are sectional views showing a production process of an ESD protection device according to another preferred embodiment of the present invention.

A substrate A schematically shown in FIG. 26A is prepared. That is, discharge electrodes 116a and 118a are formed by stacking Cu foil on a prepreg 112s and patterning the Cu foil through photolithography.

Figure 26B:
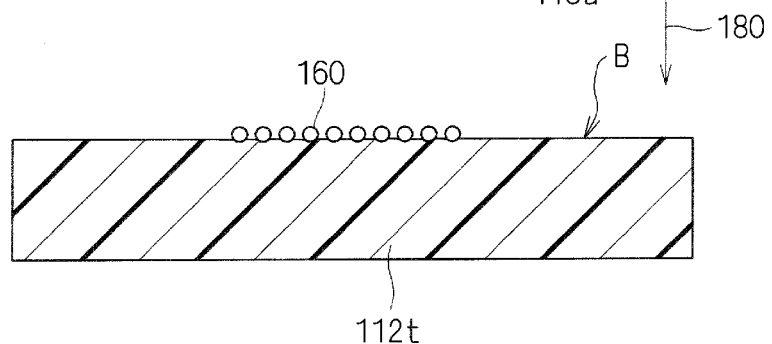

A substrate B schematically shown in FIG. 26B is prepared. Chargeable powder (hereinafter referred to as "conductive material-containing toner") 160 that includes a conductive material is disposed on a prepreg 112t in a dispersed manner by xerography.

As indicated by an arrow 180, the substrate A, which is completely cured, is disposed on the substrate B, which is semi-cured, and they are bonded to each other through the complete cure of the substrate B. A cavity is formed between an edge 116t of the discharge electrode 116a and an edge 118t of the discharge electrode 118a by the thickness of the Cu foil of the substrate A. The conductive material-containing toner 160 is supported while being sandwiched between the substrate A and the substrate B in the cavity.

Alternatively, after the substrate B is completely cured, the substrate A and the substrate B may be bonded to each other using an adhesive.

A baking electrode or a conductive resin electrode is formed on the end surfaces of the bonded substrate, and plating is performed thereon to obtain external electrodes.

Through the processes described above, the ESD protection device is completed.

In Example 2-4, substantially the same advantages as in Example 2-1 are achieved.

That is, since the responsivity to ESD is improved due to the conductive material-containing toner 160 that is in contact with the top surface and the bottom surface (the substrate A and the substrate B) that define the cavity, ESD characteristics are easily adjusted and stabilized.

Since the conductive material-containing toner 160 is in contact with both the top surface and the bottom surface (the substrate A and the substrate B) that define the cavity, the responsivity to ESD is further improved as compared to the case in which a conductive material is dispersed on only one of the surfaces.

Furthermore, since the conductive material-containing toner 160 is in contact with both the top surface and the bottom surface (the substrate A and the substrate B) that define the cavity, detachment of the conductive material-containing toner 160 from the substrate A and the substrate B is prevented. Consequently, the degradation of ESD characteristics caused by repetitive discharges, e.g., an increase in discharge starting voltage, is prevented.

Example 3-1

Figure 29:
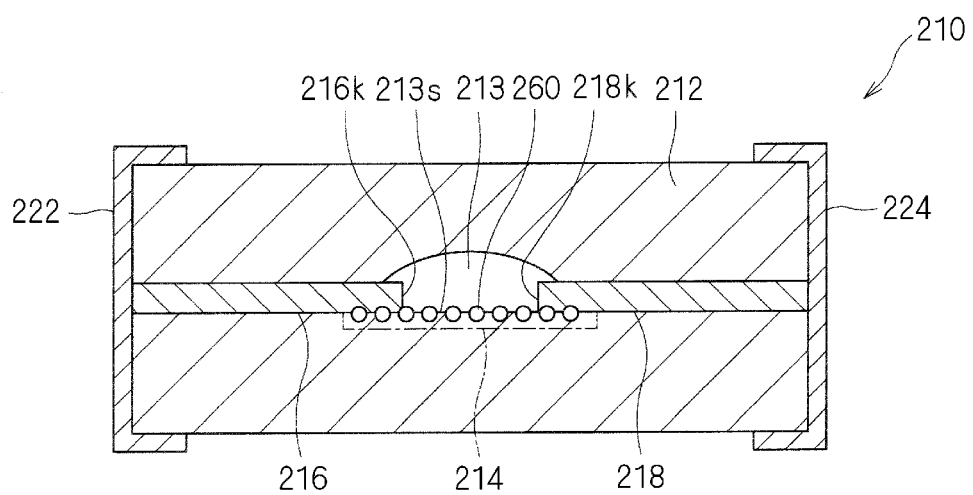
FIG. 29 is a sectional view of an ESD protection device according to another preferred embodiment of the present invention.

An ESD protection device 210 of an Example 3-1 of a preferred embodiment of the present invention will be described with reference to FIGS. 29 to 32. FIG. 29 is a sectional view of an ESD protection device 210.

As shown in FIG. 29, the ESD protection device 210 preferably includes a cavity 213 provided in a substrate body 212 of a ceramic multilayer substrate. A pair of discharge electrodes 216 and 218 are disposed such that the respective edges 216k and 218k are exposed in the cavity 213. The discharge electrodes 216 and 218 extend to the peripheral surface of the substrate body 212 and are respectively connected to external electrodes 222 and 224 provided on the surface of the substrate body 212. The external electrodes 222 and 224 are used to connect the ESD protection device 210 to a device.

The edges 216k and 218k of the discharge electrodes 216 and 218 are arranged to face each other with a space provided therebetween. When a voltage equal to or greater than a certain voltage is applied from the external electrodes 222 and 224, discharge is generated between the discharge electrodes 216 and 218 in the cavity 213.

A supporting electrode portion 214 indicated by a chain line is preferably arranged along the inner surface 213s of a region between the discharge electrodes 216 and 218, the inner surface 213s being a portion of the inner surface that define the cavity 213, and along the interface between the substrate body 212 and the discharge electrodes 216 and 218.

Figure 30:
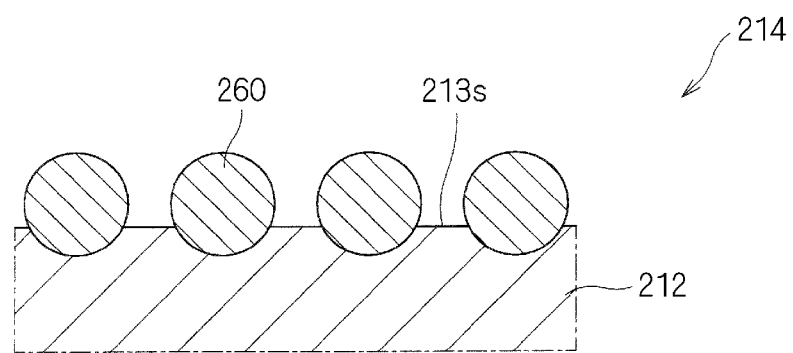
FIG. 30 is an enlarged sectional view of a principal portion of a supporting electrode portion according to another preferred embodiment of the present invention.

Specifically, as schematically shown in an enlarged sectional view of a principal part in FIG. 30, in the supporting electrode portion 214, conductive material powder 260 is preferably arranged in a single layer such that only a single particle of the conductive material powder 260 is provided in the thickness direction. As a result, particles of the conductive material powder 260 can be arranged with a high probability that the particles are separated from each other as compared to a supporting electrode portion including particles of conductive material powder that are mixed and three-dimensionally dispersed as in Comparative Example 3 described below. Therefore, the generation of short circuits between the discharge electrodes 216 and 218 is prevented and thus short-circuit resistance is improved.

Figure 31:
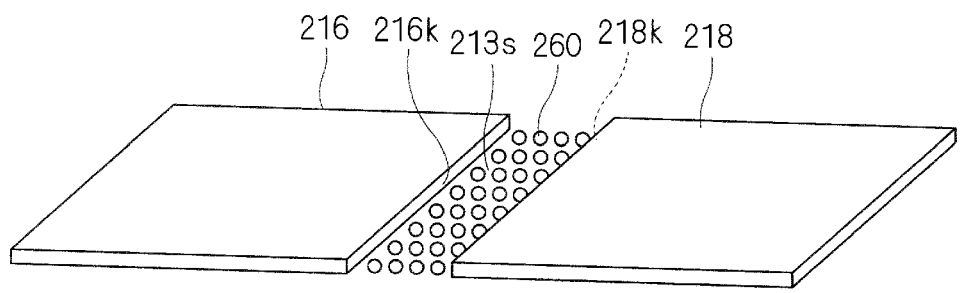
FIG. 31 is a perspective view of discharge electrodes and a supporting electrode portion according to another preferred embodiment of the present invention.

As shown in FIG. 30 and a perspective view of FIG. 31, preferably, a portion of the conductive material powder 260 protrudes from the inner surface 213s of the region between the discharge electrodes 216 and 218 into the cavity 213 and another portion is buried in the substrate body 212. When the conductive material powder 260 is exposed in the cavity 213 from the inner surface 213s between the discharge electrodes 216 and 218, creeping discharge is further promoted and the ESD characteristics are improved. For example, discharge starting voltage is decreased and the responsivity to ESD is improved.

Herein, the conductive material powder 260 may preferably be completely buried in the substrate body 212 so as not to be exposed in the cavity 213 at all.

In the supporting electrode portion 214, the conductive material powder 260 only needs to be disposed at least in the region between the discharge electrodes 216 and 218. If the supporting electrode portion 214 is arranged so that the conductive material powder 260 is further disposed outside the region, that is, along the interface between the substrate body 212 and the discharge electrodes 216 and 218, the alignment precision between the supporting electrode portion 214 and the discharge electrodes 216 and 218 is improved as compared to the case in which a supporting electrode portion is arranged so that the conductive material powder 260 is disposed in only the region between the discharge electrodes 216 and 218. Consequently, the variation in discharge starting voltage is decreased and the production cost is reduced.

The conductive material powder 260 may preferably be disposed in the region between the discharge electrodes 216 and 218 and the region peripheral thereto in a uniform density. Alternatively, the conductive material powder 260 may preferably be disposed in a non-uniform density, for example, in the form of a belt defined by a single row or a plurality of rows, a mesh, or an island, for example.

The ceramic material included in a base material of the supporting electrode portion 214 and the ceramic material included in the substrate body 212 that is present in a portion other than the supporting electrode portion 214 may be the same as or different from each other. However, if the ceramic materials are the same, the shrinkage behavior of the supporting electrode portion 214 can be easily matched with that of the substrate body 212, which decreases the number of types of materials used. The conductive material powder 260 included in the supporting electrode portion 214 may be the same as or different from that of the discharge electrodes 216 and 218. However, if the materials are the same, the shrinkage behavior of the conductive material powder 260 can be easily matched with that of the discharge electrodes 216 and 218, which decreases the number of types of materials used.

Since the supporting electrode portion 214 includes the conductive material powder 260 and the ceramic material, the shrinkage behavior of the supporting electrode portion 214 during firing can be controlled to be an intermediate shrinkage behavior between that of the discharge electrodes 216 and 218 and that of the substrate body 212. Thus, the difference in shrinkage behavior during firing between the discharge electrodes 216 and 218 and the substrate body 212 can be reduced by using the supporting electrode portion 214. As a result, failure due to, for example, detachment of the discharge electrodes 216 and 218 or characteristic variation is prevented. In addition, the variation in characteristics, such as discharge starting voltage, is prevented because the variation in the distance between the discharge electrodes 216 and 218 is prevented.

The coefficient of thermal expansion of the supporting electrode portion 214 can be adjusted to an intermediate value between that of the discharge electrodes 216 and 218 and that of the substrate body 212. Thus, the difference in a coefficient of thermal expansion between the discharge electrodes 216 and 218 and the substrate body 212 can be reduced by using the supporting electrode portion 214. As a result, failure due to, for example, detachment of the discharge electrodes 216 and 218 or the changes in characteristics over time is prevented.

By adjusting the amount and type of the conductive material powder 260 included in the supporting electrode portion 214, the discharge starting voltage can be set to a desired voltage. Thus, the discharge starting voltage can be set with high precision as compared to the case in which a discharge starting voltage is adjusted using only the distance between the discharge electrodes 216 and 218.

A method for manufacturing the ESD protection device 210 will now be described.

A material primarily including Ba, Al, and Si (BAS material) is preferably used as a ceramic material.

Raw materials are prepared and mixed so that the mixture has a desired composition, and then calcined at about 800° C. to about 1000° C. The calcined powder is pulverized using a zirconia ball mill for about 12 hours to obtain ceramic powder. An organic solvent, such as toluene or EKINEN, for example, is added the ceramic powder and mixed. A binder and a plasticizer are further added thereto and mixed to obtain slurry. The obtained slurry is molded by a doctor blade method to obtain a green sheet having a thickness of about 50 μm, for example.

Next, an electrode paste is prepared. A solvent is added to about 80 wt % Cu powder having an average particle size of about 2 μm, for example, and a binder resin made of ethyl cellulose or other suitable resin, and the mixture is stirred and mixed using a three-roll mill to obtain an electrode paste.

A resin paste including only a resin and a solvent is prepared as an elimination material by substantially the same method. A resin that is eliminated through combustion, decomposition, fusion, or vaporization when fired is preferably used. Examples of the resin include PET, polypropylene, ethyl cellulose, and acrylic resin.

A supporting electrode portion is formed on a green sheet by xerography or a transferring method.

The volume of Cu powder exposed can be set to be about 10% to about 95%, and the volume is preferably controlled to be about 20% to about 80%, for example. If the volume of Cu powder exposed is excessively small, satisfactory characteristics of discharge responsivity to ESD are not achieved. If the volume is excessively large, that is, the volume of Cu powder buried is excessively small, the Cu powder is detached from the substrate.

A supporting electrode portion is formed by xerography or a transferring method.

In the case in which the supporting electrode portion is formed by xerography, conductive material powder is processed into toner, and the supporting electrode material is formed using the prepared toner.

Specifically, the toner is prepared as follows.

1. Cu powder having an average particle size of about 3 μm, for example, and a resin are mixed with each other, and the surface of the Cu powder is covered with the resin using a surface-treating machine.

2. The sample obtained through the process 1 is classified to remove fine powder and coarse powder.

3. The capsulated Cu powder obtained through the process and an external additive are mixed with each other, and the external additive is uniformly attached to the surface of the capsulated Cu powder using a surface-treating machine.

4. The capsulated Cu powder obtained through the process 3 and a carrier are mixed with each other to obtain a developer.

Specifically, the supporting electrode portion is formed as follows.

1. A photoconductor is uniformly charged.

2. The charged photoconductor is irradiated with light using an LED in a pattern of a supporting electrode portion, to form a latent image.

3. A development bias is applied to the photoconductor to develop the toner on the photoconductor. The amount of the toner applied is controlled using the bias.

4. A ceramic green sheet is disposed on the photoconductor on which a pattern of the supporting electrode portion has been developed, to transfer the toner onto the ceramic green sheet.

5. The ceramic green sheet onto which the pattern of the supporting electrode portion has been transferred is inserted into an oven to fix the toner. Thus, a ceramic green sheet having a pattern of a supporting electrode portion is obtained.

6. The volume of conductive material powder exposed in the cavity, i.e., the volume of conductive material powder buried, is controlled by adjusting the pressure applied when the ceramic green sheet is disposed on the photoconductor to transfer the toner onto the ceramic green sheet. Alternatively, the volume is controlled by adjusting the pressure applied, using a roller or other pressure applying device, to the surface of the ceramic green sheet onto which the toner has been transferred.

In the case of a transferring method, the supporting electrode portion is formed as follows.

1. A photosensitive adhesive sheet is irradiated with light in a pattern of a supporting electrode portion.

2. Cu powder having an average particle size of about 3 μm is provided on the photosensitive adhesive sheet so that the Cu powder is attached in the pattern formed on the photosensitive adhesive sheet. The amount of the conductive material powder applied is controlled by dividing the pattern into a mesh.

3. The photosensitive adhesive sheet having the Cu powder disposed thereon is transferred onto the ceramic green sheet to form a pattern of a supporting electrode portion.

4. The volume of the Cu powder exposed in the cavity is controlled by adjusting the pressure applied during transfer.

The electrode paste is applied by screen printing on the green sheet including the supporting electrode portion formed thereon to form discharge electrodes having a discharge gap therebetween. Herein, the discharge electrodes were formed so that the width of each of the discharge electrodes was preferably about 100 µm, for example, and the discharge gap between the discharge electrodes was preferably about 30 µm, for example. The resin paste is applied thereon at a position at which a cavity is to be formed.

Lamination and press bonding are performed in substantially the same manner as in a typical multilayer product. Herein, the lamination was performed so that the thickness was preferably set to be about 0.35 mm, for example, and the discharge electrodes and the resin paste corresponding to a cavity were arranged in the approximate center in the thickness direction.

The laminated body is cut into chips using a die in substantially the same manner as in a chip-type product, such as an LC filter. Herein, the laminated body was cut into chips each having a size of about 1.0 mm×about 0.5 mm, for example. After that, the electrode paste is applied to end surfaces to form external electrodes.

Firing is performed in a N2 atmosphere in substantially the same manner as in a typical multilayer product. The resin paste is eliminated during firing, and thus, a cavity is formed.

In the case in which an inert gas, such as Ar or Ne, for example, is introduced into the cavity to decrease the response voltage to ESD, firing may be performed in an atmosphere of an inert gas, such as Ar or Ne, for example, in a temperature range in which a ceramic material is shrunk and sintered. If the electrode material is not oxidized (e.g., Ag), the firing may be performed in the air.

Electrolytic Ni plating and Sn plating are performed on the external electrodes in substantially the same manner as in a chip-type product, such as an LC filter.

Through the processes described above, the ESD protection device is completed.

The ceramic material of the substrate body is not particularly limited to the above-described material as long as the ceramic material has an insulating property. Therefore, such a ceramic material may be a mixture of forsterite and glass, a mixture of $CaZrO_3$ and glass, or other suitable material, for example.

The electrode material of the discharge electrodes is also not limited to Cu, and may be Ag, Pd, Pt, Al, Ni, W, or a combination thereof, for example.

The conductive material powder used for the supporting electrode portion is preferably at least one metal selected from transition metals, such as Cu, Ni, Co, Ag, Pd, Rh, Ru, Au, Pt, and Ir, for example. These metals may be used alone or in a form of an alloy. Furthermore, a metal oxide of these metals may be used. A material having low conductivity such as a semiconductor material or a resistive material can also be used as the conductive material.

Figure 32:
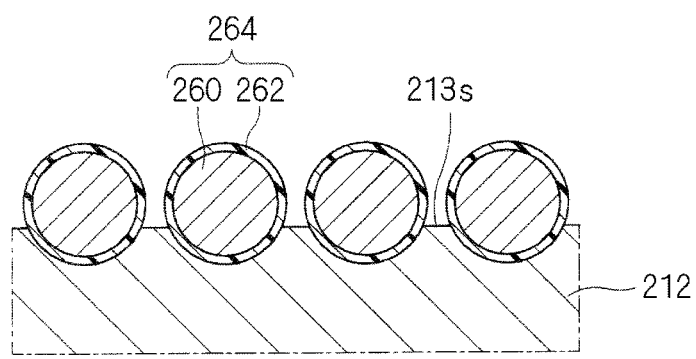
FIG. 32 is an enlarged sectional view of a principal portion of a supporting electrode portion according to another preferred embodiment of the present invention.

As schematically shown in an enlarged sectional view of a principal portion in FIG. 32, the supporting electrode portion may preferably be formed using particles 264 each having a coating layer 262, the particles 264 preferably being obtained by coating the surface of powder 260 of such metals with an inorganic material, such as $Al_2O_3$, $ZrO_2$, or $SiO_2$ or a mixed calcined material, such as BAS, for example. Alternatively, particles each coated with a coating layer 262 made of an organic material, such as a resin may be used. By using such coated powder, the contact between particles of the conductive material powder is prevented and the short-circuit resistance is improved.

The coating material is preferably a material that is eliminated through combustion, decomposition, fusion, or vaporization when fired so that the surface of the conductive material powder is exposed. However, the material is not necessarily completely eliminated, and a material having a thickness of about 10 nm, for example, may remain.

The average particle size of the conductive material powder is preferably in a range of about 0.05 µm to about 10 µm, and more preferably about 0.1 µm to about 5 µm, for example. The surface area of the conductive material powder exposed in the cavity is increased as the particle size is decreased, whereby discharge starting voltage is decreased and the responsivity to ESD is improved.

Although the resin paste has been applied to form the cavity, any material, such as carbon, for example, may be used instead of a resin as long as the material is eliminated during firing. Pasting and printing are not necessarily performed. Instead, a resin film may be attached to a position at which a cavity is to be formed.

Comparative Example 3

An ESD protection device 210x of a Comparative Example 3 will be described with reference to FIGS. 35 and 36.

Figure 35:
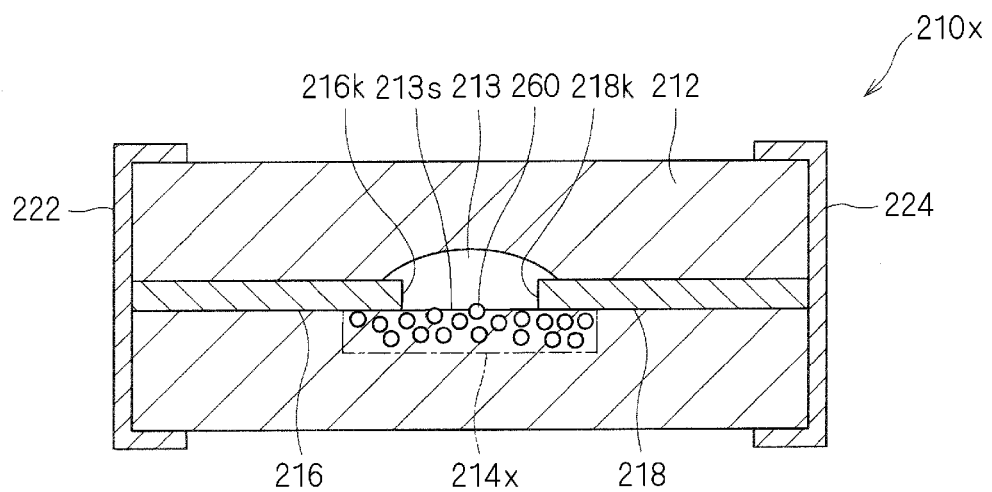
FIG. 35 is a sectional view of an ESD protection device of a Comparative Example 3.

As shown in a sectional view of FIG. 35, the ESD protection device 210x of Comparative Example 3 has substantially the same configuration as that of the ESD protection device 210 of Example 3-1, except for the configuration of a supporting electrode portion 214x provided near the inner surface 213s of the cavity 213 between the discharge electrodes 216 and 218.

Figure 36:
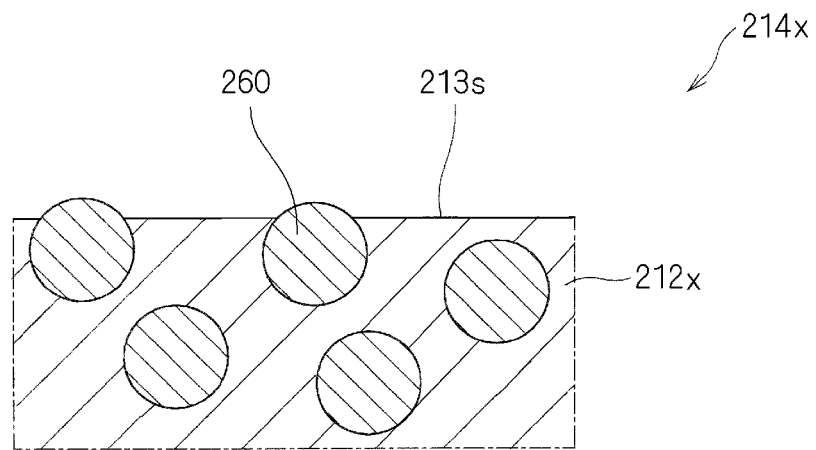
FIG. 36 is an enlarged sectional view of a principal portion of the supporting electrode portion of the Comparative Example 3.
Figure 37:
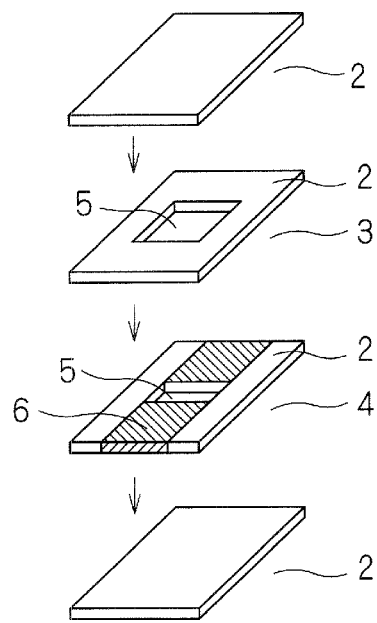
FIG. 37 is an exploded perspective view of a known ESD protection device.
Figure 38:
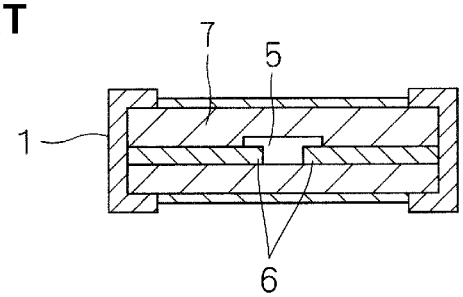
FIG. 38 is a sectional view of the known ESD protection device shown in FIG. 37.

As schematically shown in a sectional view of a principal portion in FIG. 36, in the supporting electrode portion 214x of the ESD protection device 210x of Comparative Example 3, the conductive material powder 260 is not disposed in a single layer such that only a single particle of the conductive material powder 260 is provided in the thickness direction, and is mixed in the base material and three-dimensionally disposed in a dispersed manner.

The ESD protection devices of Comparative Example 3 and Example 3-1 were manufactured and compared to each other.

Specifically, 100 samples having different ratios (Cu ratios) of the area of conductive material powder (Cu), of the supporting electrode portion, exposed in the cavity relative to the area of the supporting electrode portion were produced for each of Comparative Example 3 and Example 3-1. Short circuits between discharge electrodes and the discharge responsivity to ESD were evaluated.

The discharge responsivity to ESD was measured using an electrostatic discharge immunity test provided in IEC61000-4-2, which is the standard of IEC. When a voltage of about 2 kV to about 8 kV was applied through contact discharge, whether discharge was generated between the discharge electrodes of the samples was measured.

Table 2 shows the results.

TABLE 2

|      | Cu ratio | Parentage of short circuits | Discharge responsivity to ESD | | | |
|------|----------|-----------------------------|------|------|------|------|
|      |          |                             | 2 kV | 4 kV | 6 kV | 8 kV |
| C.E. A | 20% | 0%  | — | — | — | D |
| C.E. B | 35% | 10% | — | — | D | D |
| C.E. C | 50% | 20% | — | D | D | D |
| C.E. D | 65% | 30% | D | D | D | D |
| Ex. 1  | 65% | 0%  | D | D | D | D |

C.E.: Comparative Example
Ex.: Example

Herein, Cu ratio=(area of Cu powder exposed in cavity)/(area of supporting electrode portion).

As is clear from Table 2, by providing the structure of Example 3-1 including the supporting electrode portion in which the conductive material powder is disposed in a single layer such that only a single particle of the conductive material powder is provided in the thickness direction, the discharge responsivity to ESD equal to or better than that of Comparative Example 3 including the supporting electrode portion in which the conductive material powder is disposed in a mixed arrangement is achieved while the short-circuit resistance is improved.

As described above, by using a supporting electrode portion including a structure in which conductive material powder is disposed in a single layer such that only a single particle of the conductive material powder is provided in the thickness direction, discharge starting voltage can be set with high precision. As a result, a probability that particles of conductive material powder contact each other is decreased and, thus, the short-circuit resistance is improved. By exposing a portion of the conductive material powder in the cavity so as to increase the surface area of the conductive material powder exposed in the cavity, a discharge phenomenon is further promoted, which further decreases the discharge starting voltage and improves the responsivity to ESD.

Example 3-2

An ESD protection device 210a of an Example 3-2 of a preferred embodiment of the present invention will be described with reference to FIG. 33.

Figure 33:
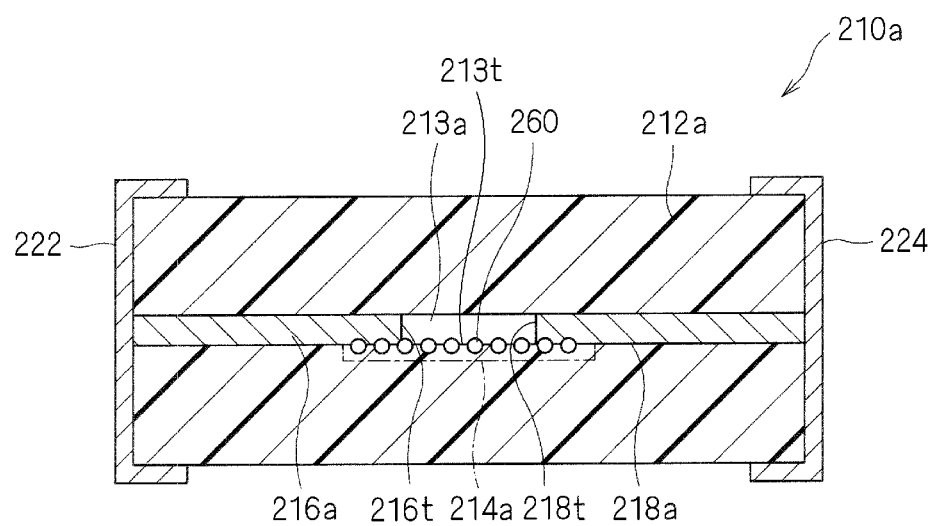
FIG. 33 is a sectional view of an ESD protection device according to another preferred embodiment of the present invention.

FIG. 33 is a sectional view of an ESD protection device 210a of Example 3-2. As shown in FIG. 33, the ESD protection device 210a of Example 3-2 has substantially the same configuration as that of the ESD protection device 210 of Example 3-1.

That is, a cavity 213a is provided inside a substrate body 212a and the edges 216t and 218t of a pair of discharge electrodes 216a and 218a arranged to face each other are exposed in the cavity 213a. The discharge electrodes 216a and 218a are respectively connected to external electrodes 222 and 224 provided on a surface of the substrate body 212a. In a supporting electrode portion 214a, conductive material powder 260 is preferably disposed along the inner surface 213t of the cavity 213a between the discharge electrodes 216a and 218a and along the interface between the discharge electrodes 216a and 218a and the substrate body 212a, the conductive material powder 260 being disposed in a single layer such that only a single particle of the conductive material powder 260 is provided in the thickness direction.

The ESD protection device 210a of Example 3-2 is substantially the same as the ESD protection device 210 of Example 3-1, except that the substrate body 212a is not made of a ceramic material, and instead, is made of a resin material.

A method for manufacturing the ESD protection device 210a of Example 3-2 will now be described with reference to an exploded sectional view of FIGS. 34A and 34B.

Figure 34A:
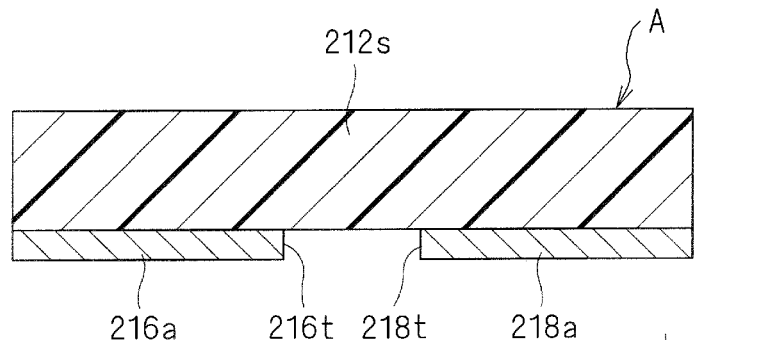
FIGS. 34A and 34B are sectional views of a principal portion of a supporting electrode portion according to another preferred embodiment of the present invention.

A substrate A shown in FIG. 34A is prepared. That is, discharge electrodes 216a and 218a are formed by stacking Cu foil on a prepreg 212s and patterning the Cu foil through photolithography.

Figure 34B:
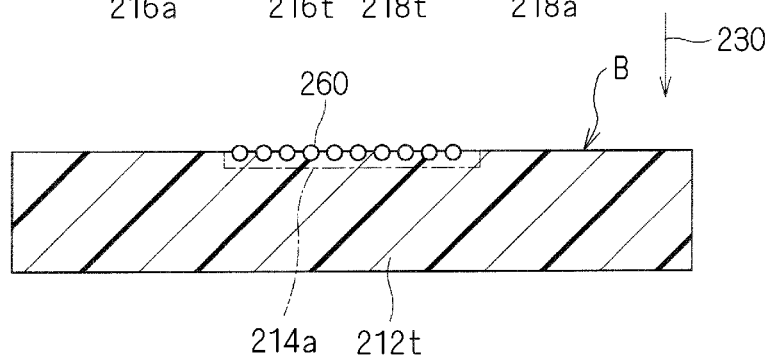

A substrate B shown in FIG. 34B is prepared. A supporting electrode portion 214a is formed by disposing conductive material powder 260 (e.g., Cu powder) on a prepreg 212t, the conductive material powder 260 being disposed in a single layer such that only a single particle of the conductive material powder 260 is provided in the thickness direction. The conductive material powder 260 is disposed by the same or substantially the same method as in Example 3-1, such as xerography or a transferring method.

The substrate A, which is completely cured, is disposed on the substrate B, which is semi-cured body, and they are bonded to each other through the complete cure of the substrate B. A cavity 213a is formed by the thickness of the Cu foil of the substrate A. Alternatively, after the substrate B is completely cured, the substrate A and the substrate B may be bonded to each other using an adhesive.

A baked electrode or a conductive resin electrode is formed on the end surfaces of the bonded substrate, and plating is performed thereon to obtain external electrodes.

Through the processes described above, the ESD protection device 210a is completed.

In Example 3-2, substantially the same advantages as in Example 3-1 are achieved. In other words, by providing a structure in which conductive material powder is disposed in a single layer such that only a single particle of the conductive material powder is provided in the thickness direction, a probability that particles of conductive material powder contact each other is decreased and, thus, the short-circuit resistance is improved. By exposing portion of the conductive material powder in the cavity so as to increase the surface area of the conductive material powder exposed in the cavity, a discharge phenomenon is further promoted, which further decreases the discharge starting voltage and improves the responsivity to ESD.

As described above, supporting electrode particles including a supporting electrode material having conductivity are dispersed in a cavity provided inside a substrate body, whereby the discharge responsivity to ESD is improved. The fluctuation in responsivity to ESD caused by variation in the distance between discharge electrodes is reduced. Therefore, the ESD characteristics can be easily adjusted and stabilized.

By providing a structure in which a conductive material is sandwiched between a top surface and a bottom surface that define a cavity, ESD characteristics are easily adjusted and stabilized and, thus, the degradation of discharge characteristics caused by repetitive discharges is prevented.

By providing a supporting electrode portion in which conductive material powder is disposed in a single layer such that only a single particle of the conductive material powder is provided in the thickness direction, the discharge starting voltage can be set with high precision and, thus, an ESD protection device with high reliability can be manufactured.

The present invention is not limited to the above-described preferred embodiments, and various modifications can be made.

For example, the substrate body may be an insulating substrate made of an insulating material other than a ceramic or resin material.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing an electrostatic discharge (ESD) protection device comprising:
    a first step of forming a supporting electrode portion by disposing conductive material powder in a single layer such that only a single particle of the conductive material powder is provided in a thickness direction, the conductive material powder being disposed on a principal surface of a first insulating layer;
    a second step of forming at least one pair of discharge electrodes on the principal surface of the first insulating layer so that at least one portion of the supporting electrode portion is exposed between the at least one pair of discharge electrodes;
    a third step of forming a second insulating layer on the principal surface of the first insulating layer so that the second insulating layer coats the at least one pair of discharge electrodes and covers an exposed region at which the at least one portion of the supporting electrode portion is exposed between the at least one pair of discharge electrodes, the second insulating layer being separated from the exposed region; and
    a fourth step of forming external electrodes on a surface of a laminated body obtained through the third step such that the external electrodes are connected to the at least one pair of discharge electrodes; wherein
    a cavity surrounded by the second insulating layer, the as least one pair of discharge electrodes, and the exposed region is formed.

2. The method for manufacturing an electrostatic discharge (ESD) protection device according to claim 1, wherein
    in the second step, a cavity-forming layer including an elimination material is formed on at least a portion of the supporting electrode portion that is to be exposed between the at least one pair of discharge electrodes; and
    after the second insulating layer is formed on the cavity-forming layer in the third step, the cavity is formed by eliminating at least a portion of the cavity-forming layer including the elimination material.

3. The method for manufacturing an electrostatic discharge (ESD) protection device according to claim 1, wherein, in the first step, the supporting electrode portion is formed by transferring, onto the first insulating layer, conductive material powder disposed in a single layer such that only a single particle of the conductive material powder is provided in a thickness direction.

4. The method for manufacturing an electrostatic discharge (ESD) protection device according to claim 1, wherein, in the first step, the supporting electrode portion is formed by xerography.

5. The method for manufacturing an electrostatic discharge (ESD) protection device according to claim 1, wherein, in the first step, the conductive material powder, of the supporting electrode portion, disposed on the principal surface of the first insulating layer and in a single layer such that only a single particle of the conductive material powder is provided in a thickness direction, is coated with an elimination material.

* * * * *